(12) United States Patent
Tamura

(10) Patent No.: US 7,821,077 B2
(45) Date of Patent: Oct. 26, 2010

(54) SEMICONDUCTOR DEVICE

(75) Inventor: Naoyoshi Tamura, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 624 days.

(21) Appl. No.: 11/168,548

(22) Filed: Jun. 29, 2005

(65) Prior Publication Data
US 2006/0220142 A1 Oct. 5, 2006

(30) Foreign Application Priority Data
Mar. 31, 2005 (JP) ............................. 2005-104234

(51) Int. Cl.
*H01L 29/76* (2006.01)
(52) U.S. Cl. .................. 257/374; 257/253; 257/239; 257/E29.019; 257/E29.02; 257/510; 257/368; 257/500; 438/253; 438/239
(58) Field of Classification Search ................. 257/374, 257/510, 500, 368, 640
See application file for complete search history.

(56) References Cited

U.S. PATENT DOCUMENTS

| | | | | |
|---|---|---|---|---|
| 6,303,432 | B1 * | 10/2001 | Horita et al. ................ | 438/253 |
| 6,306,432 | B1 * | 10/2001 | Shirley et al. ............... | 424/450 |
| 6,974,981 | B2 | 12/2005 | Chidambarrao et al. | |
| 2002/0070420 | A1 * | 6/2002 | Oh et al. ..................... | 257/506 |
| 2004/0080019 | A1 * | 4/2004 | Oh et al. ..................... | 257/510 |
| 2004/0113174 | A1 | 6/2004 | Chidambarrao et al. | |
| 2004/0248374 | A1 | 12/2004 | Belyansky et al. | |
| 2005/0121727 | A1 | 6/2005 | Ishitsuka et al. | |
| 2005/0179112 | A1 | 8/2005 | Belyansky et al. | |
| 2005/0194646 | A1 * | 9/2005 | Inoue et al. ................. | 257/374 |
| 2005/0280051 | A1 | 12/2005 | Chidambarrao et al. | |
| 2006/0125043 | A1 * | 6/2006 | Smythe et al. .............. | 257/506 |

FOREIGN PATENT DOCUMENTS

| | | |
|---|---|---|
| CN | 1507032 A | 6/2004 |
| JP | 11-54605 A | 2/1999 |
| JP | 2003-158241 A | 5/2003 |
| JP | 2003-273206 A | 9/2003 |
| JP | 2004-363595 A | 12/2004 |

OTHER PUBLICATIONS

Patent Abstracts of Japan, Publication No. 2003203989 A, published on Jul. 18, 2003.
Office Action dated Aug. 11, 2006, issued in corresponding Korean Application No. 2005-54833.
Chinese Office Action dated Apr. 25, 2008, issued in corresponding application No. 200510084551.1.
Japanese Office Action dated Dec. 2, 2008 issued in corresponding Japanese Application No. 2005-104234.

* cited by examiner

*Primary Examiner*—Wael M Fahmy
*Assistant Examiner*—Marc Armand
(74) *Attorney, Agent, or Firm*—Westerman, Hattori, Daniels & Adrian, LLP

(57) ABSTRACT

The active region of an NMOS transistor and the active region of a PMOS transistor are divided by an STI element isolation structure. The STI element isolation structure is made up of a first element isolation structure formed so as to include the interval between both active regions, and a second element isolation structure formed in the region other than the first element isolation structure.

13 Claims, 22 Drawing Sheets

FIG. 6
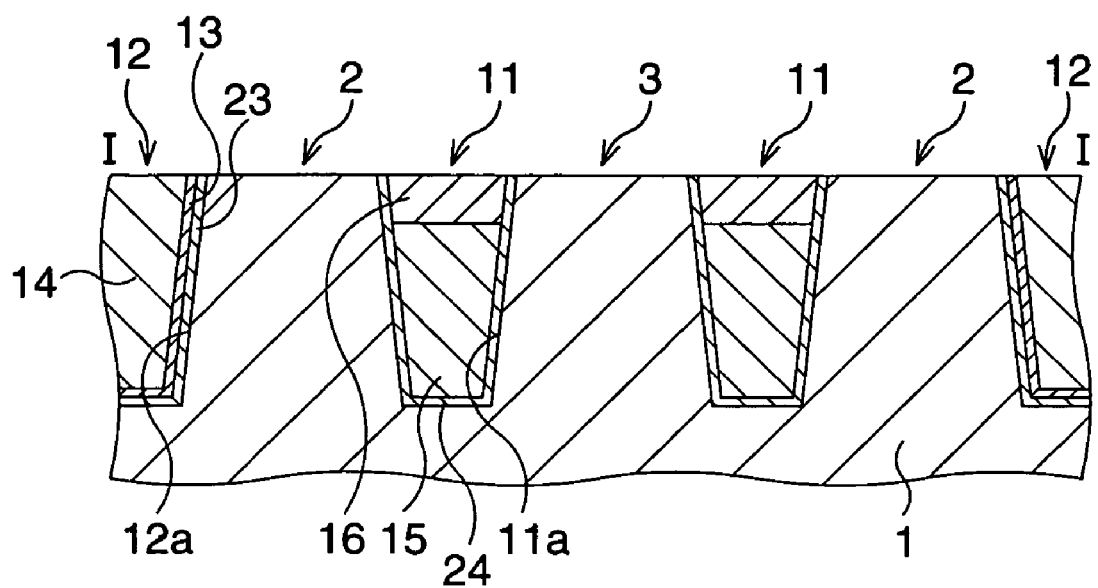
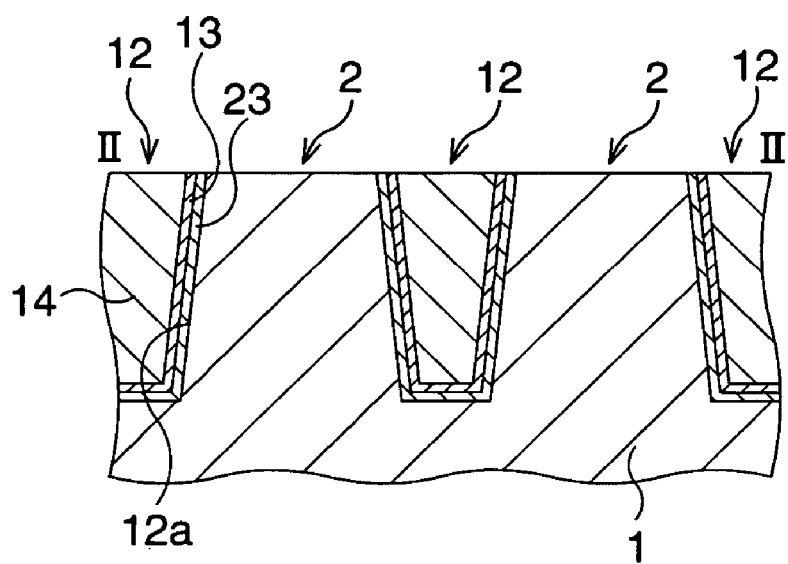

FIG. 9
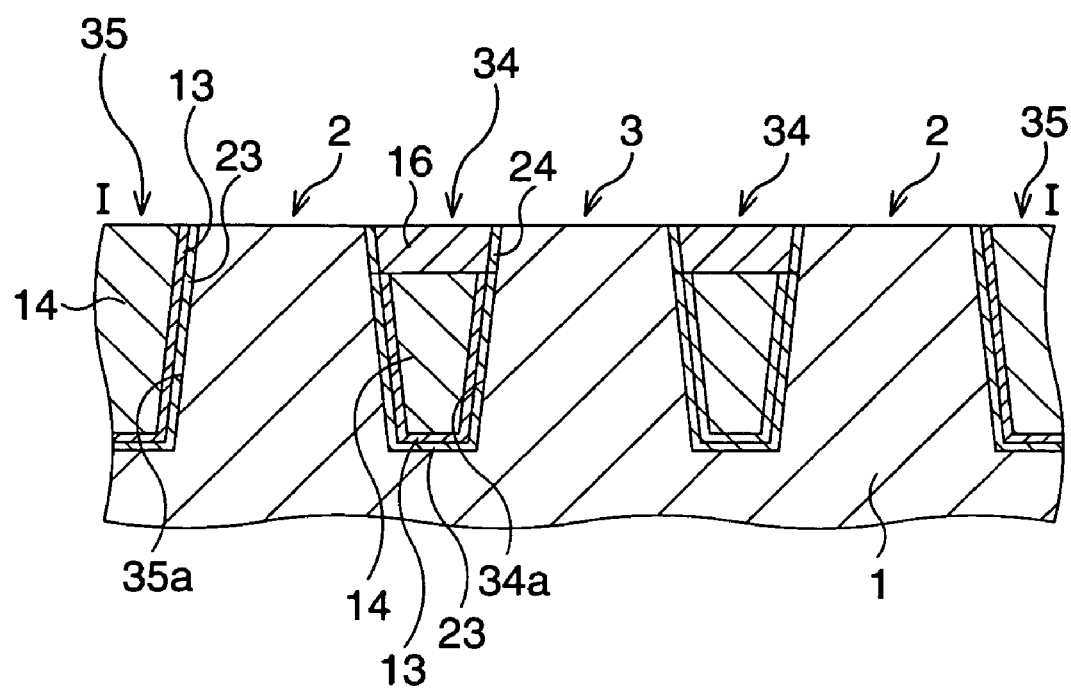
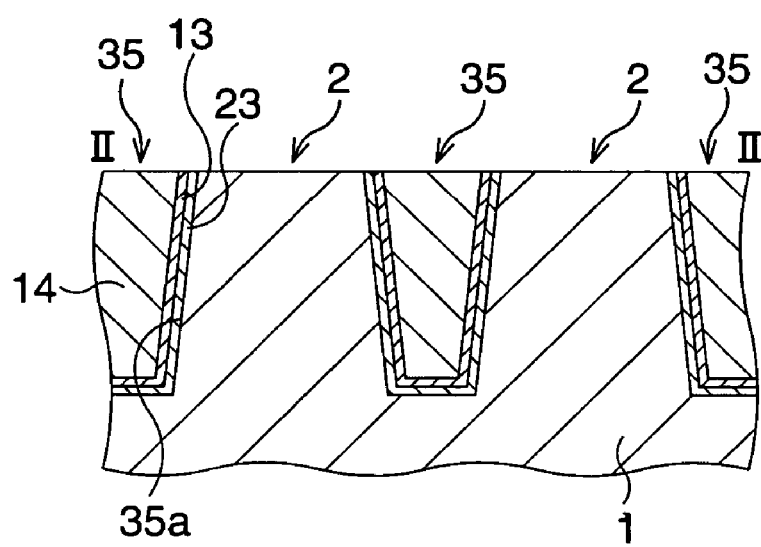

FIG. 12
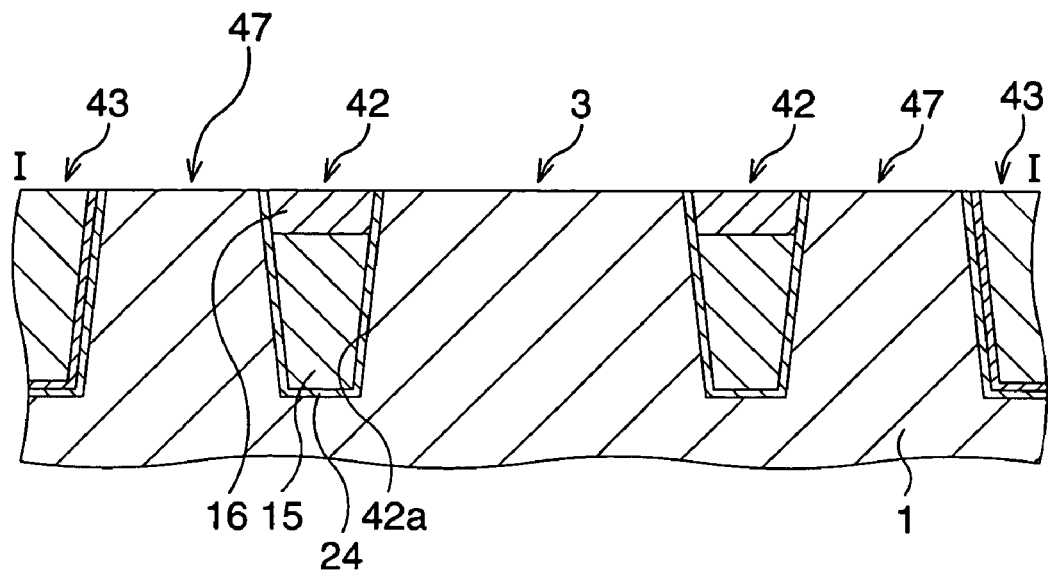
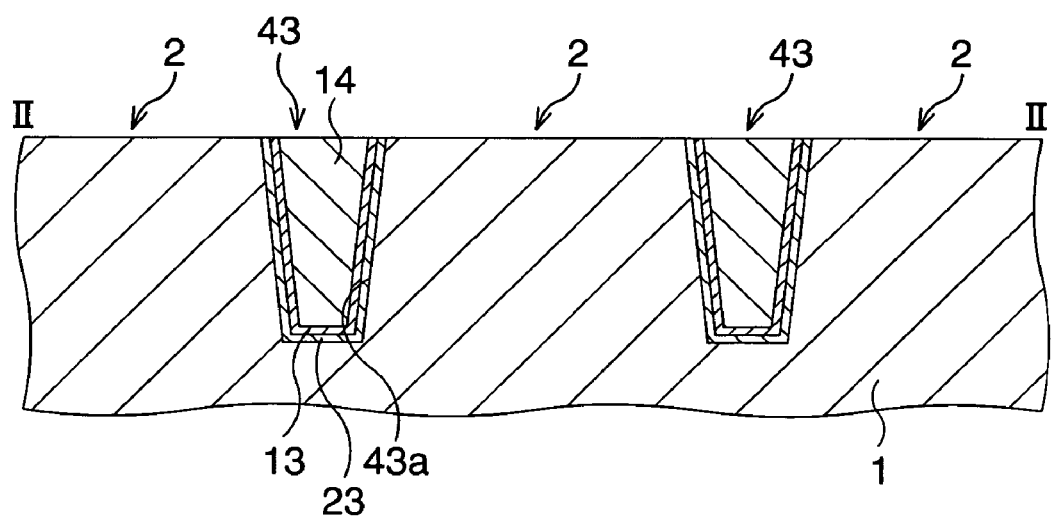

FIG. 15
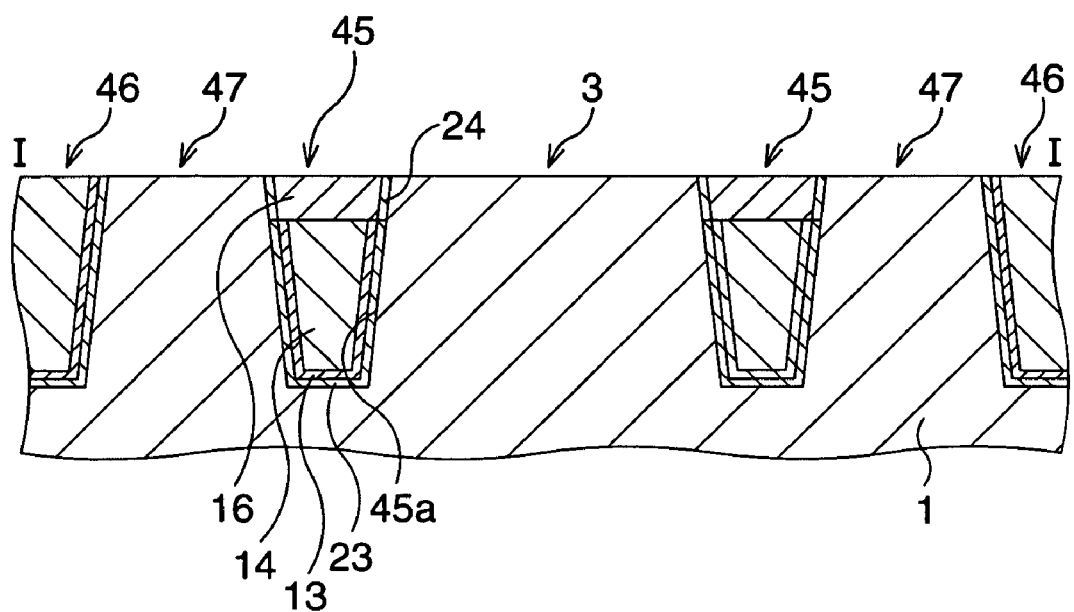
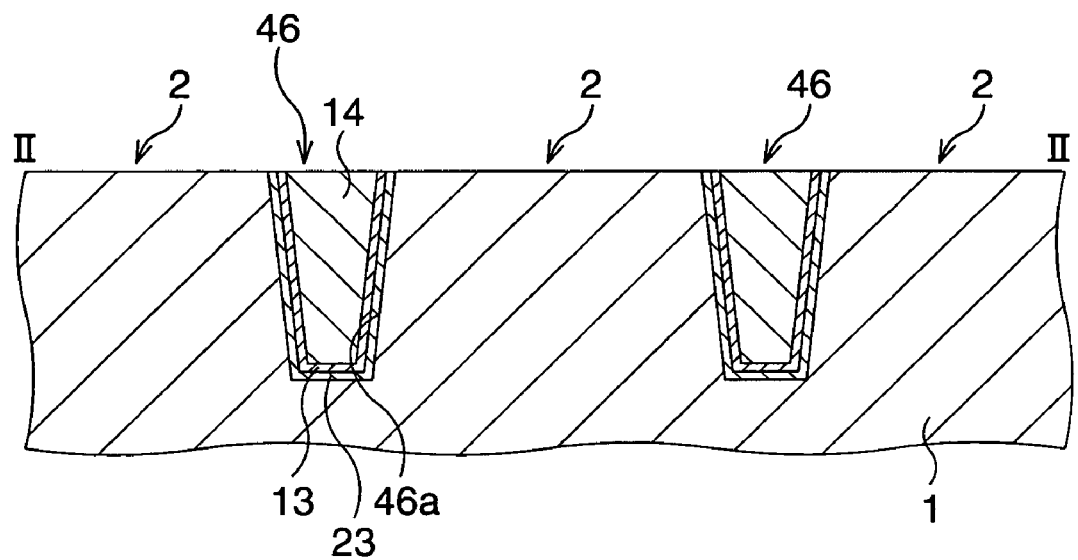

SEMICONDUCTOR DEVICE

CROSS-REFERENCE TO RELATED APPLICATIONS

This application is based upon and claims the benefit of priority from the prior Japanese Patent Application No. 2005-104234, filed on Mar. 31, 2005, the entire contents of which are incorporated herein by reference.

BACKGROUND OF THE INVENTION

1. Field of the Invention

The present invention relates to a semiconductor device having an element isolation structure by an STI (Shallow Trench Isolation) method, and also to a manufacturing method of the semiconductor device.

2. Description of the Related Art

Conventionally, element isolation structures by STI methods, in each of which a trench formed in an element isolation region is filled with an insulating material to ensure electrical insulation between active regions, (hereinafter simply referred to as STI element isolation structures), are used as element isolation structures of semiconductor devices. The STI element isolation structures are expected to meet recent requirement of further reduction in scale of semiconductor elements because such STI element isolation structures can make sure element isolation with no protrusion from the surface of the substrate, such as a field oxidation film by a so-called LOCOS method.

(Patent Document 1)

Japanese Patent Application Laid-open No. 2003-203989

In an element isolation structure as represented by an STI element isolation structure, an insulating material for element isolation applies a compressive stress to a neighboring element region. That is, although silicon oxide having its dielectric constant of 3.9 is normally used as the insulating material for an STI element isolation structure so as to avoid an increase in parasitic capacitance, the silicon oxide applies a compressive stress to a neighboring active region because the silicon oxide is made with volume expansion relatively to the original silicon. Under the influence of such a compressive stress, variation in element characteristics by size appears remarkably. When the compressive stress increases to exceed the elastic limit of the parent crystal of the semiconductor substrate, dislocation, stacking fault, or the like, is generated and it brings about, for example, PN-junction leak. The influence of such a compressive stress is more remarkable as the element size is reduced. Therefore, making the compressive stress the minimum brings about an improvement of yield of semiconductor elements and it contributes further scale-down of a semiconductor element.

Further, it has been found by recent study that the influence of a compressive stress upon an active region by an STI element isolation structure varies between a first conductivity type element, for example, a first conductivity type (N type) MOS transistor (NMOS transistor), and a second conductivity type element, for example, a second conductivity type (P type) MOS transistor (PMOS transistor). That is, in the case of an NMOS transistor, either of a compressive stress in a direction parallel to the length of the channel to an active region (in a channel length direction), and a compressive stress in a direction parallel to the width of the channel (in a channel width direction), causes a decrease in operation current. Contrastingly, in the case of a PMOS transistor, only a compressive stress in a channel width direction to an active region causes a decrease in operation current, and a compressive stress in a channel length direction contributes an improvement of the operation current.

In the case that a trench formed in an element isolation region is filled with an insulating material to make an STI element isolation structure, compressive stresses applied from the STI element isolation structure to active regions are inevitably isotropic. Therefore, when such an STI element isolation structure is used for a CMOS transistor in which N-type and P-type MOS transistors are formed on the same semiconductor substrate, it is difficult to improve both the operation currents of the N-type and P-type MOS transistors.

On this point, as a method for avoiding a decrease in operation current, a technique has been devised in which the intervals between neighboring active regions (that is, the width of each STI element isolation structure) are varied between a channel length direction and a channel width direction, for example, as disclosed in JP-A-2003-203989. Even in this case, however, because compressive stresses applied from the STI element isolation structure to active regions are isotropic, control of the compressive stresses is insufficient, and it is difficult to cope with a CMOS transistor as described above.

On the other hand, a trial is made in which each channel region is formed in a direction equivalent to (100). By this technique, each channel region is in a state of having been rotated by 45° from its ordinary position, and the quantity of strain (the quantity of stress tensor) when a stress in a direction along the channel region is applied to an active region is remarkably decreased. Thus, the strain due to the stress from oxide is held down and the above quantity of stress tensor is decreased. On the other hand, however, it is difficult to positively give an active region a strain of a desired intensity in a desired direction so as to improve the operation current in the active region, and it is not expected to considerably improve characteristics by introducing a strain into an active region.

On the other hand, a technique has been devised in which an insulating film for buffering a compressive stress (a liner nitride film) is interposed between silicon and silicon oxide in an STI element isolation structure. However, even when such a liner nitride film is provided, there still remains pressure on an STI side wall by the silicon oxide of the STI element isolation structure, and it is difficult to reduce the pressure. In this case, a method is also known in which the thickness of the liner nitride film is controlled to be equivalent to the thickness of the silicon oxide. However, there is a large influence upon an increase in parasitic capacitance by the STI element isolation structure.

SUMMARY OF THE INVENTION

An object of the present invention is to provide a semiconductor device that intends to improve both the operation currents of first and second conductivity type elements, and contributes further scale-down of element size, without any change in transistor structure and without adding any extra manufacturing step after formation of an element isolation structure, and to provide a manufacturing method of the semiconductor device.

According to an aspect of the present invention, a semiconductor device comprises an element isolation structure in which trenches formed in an element isolation region on a semiconductor substrate are filled up with insulating materials; a first conductivity type element formed in a first active region divided by the element isolation structure; and a second conductivity type element formed in a second active region divided by the element isolation structure. The element isolation structure comprises a first element isolation region of the element isolation region including regions adjacent to a pair of opposed ends of the second active region. The first element isolation region is filled with an insulating material that gives a compressive stress to the second active region. The element isolation structure further comprises a second element isolation region of the element isolation region other than the first element isolation region. The second element isolation region is filled with an insulating material that gives a tensile stress to each of the first and second active regions.

According to another aspect of the present invention, there is provided a manufacturing method of a semiconductor device in which first and second active regions are divided by an element isolation structure formed in an element isolation region on a semiconductor substrate, and first and second conductivity type elements are formed in the first and second active regions, respectively. The element isolation region comprises a first element isolation region including regions adjacent to a pair of opposed ends of the second active region, and a second element isolation region other than the first element isolation region. The method comprises the steps of forming a first trench in the second element isolation region on the semiconductor substrate, and filling up the first trench with an insulating material that gives a tensile stress to each of the first and second active regions; and forming a second trench in the first element isolation region on the semiconductor substrate, and filling up the second trench with an insulating material that gives a compressive stress to the second active region.

According to still another aspect of the present invention, there is provided a manufacturing method of a semiconductor device in which first and second active regions are divided by an element isolation structure formed in an element isolation region on a semiconductor substrate, and first and second conductivity type elements are formed in the first and second active regions, respectively. The element isolation region comprises a first element isolation region including regions adjacent to a pair of opposed ends of the second active region, and a second element isolation region other than the first element isolation region. The method comprises the steps of forming a first trench in the element isolation region on the semiconductor substrate, and filling up the first trench with an insulating material that gives a tensile stress to each of the first and second active regions; and forming a second trench in a portion of the insulating material having filled up the first trench to give a tensile stress, corresponding to the first element isolation region, and filling up the second trench with an insulating material that gives a compressive stress to the second active region.

BRIEF DESCRIPTION OF THE DRAWINGS

FIGS. 2-2A to 2-2C are schematic sectional views showing the manufacturing method of the CMOS transistor according to the first embodiment, in the order of manufacturing steps, subsequent to FIG. 2-1;

FIG. 6 shows schematic sectional views taken along broken lines I-I and II-II in FIG. 4, put in parallel;

FIG. 9 shows schematic sectional views taken along broken lines I-I and II-II in FIG. 8, put in parallel;

FIG. 12 shows schematic sectional views taken along broken lines I-I and II-II in FIG. 11, put in parallel;

FIG. 15 shows schematic sectional views taken along broken lines I-I and II-II in FIG. 14, put in parallel;

DETAILED DESCRIPTION OF THE PREFERRED EMBODIMENTS

Fundamental Essence of the Invention

Figure 1:
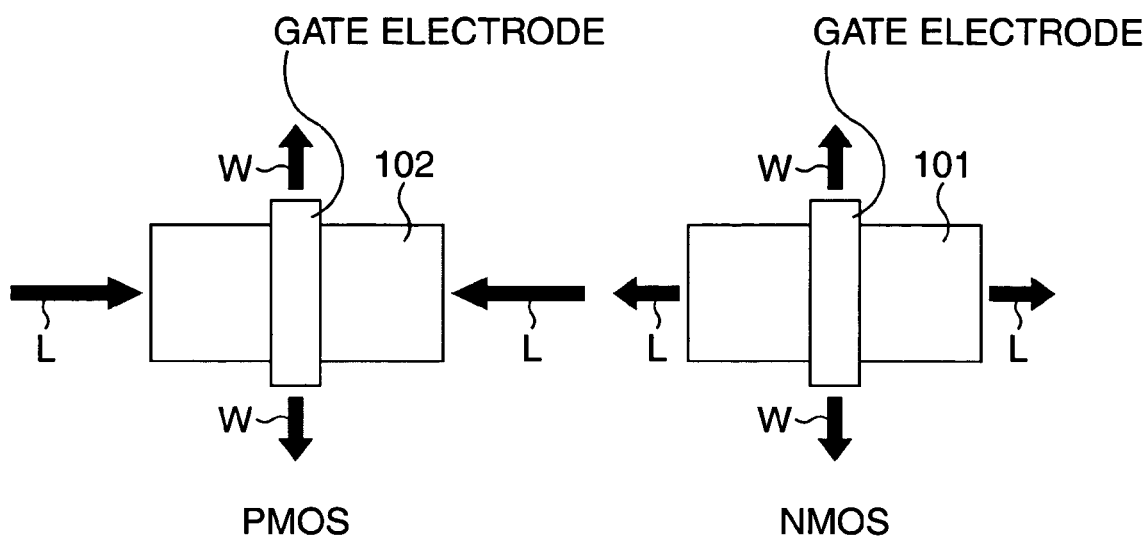
FIG. 1 schematically shows N-type and P-type transistors for explaining directions of stresses that cause an increase in operation current.

In a CMOS transistor, as shown in FIG. 1, in the case of an NMOS transistor, by buffering compressive stresses to its active region 101 in either of channel length directions (directions indicated by arrows L) and channel width directions (directions indicated by arrows W), or by positively giving the active region 101 tensile stresses in either of the channel length directions and the channel width directions, its operation current can be prevented from decreasing or can be increased. Contrastingly, in the case of a PMOS transistor, by positively giving its active region 102 compressive stresses in channel length directions (directions indicated by arrows L) and by buffering compressive stresses to the active region 102 in channel width directions (directions indicated by arrows W), or by positively giving the active region 102 tensile stresses in either of the channel length directions and the channel width directions, its operation current can be prevented from decreasing or can be increased.

The inventor of the present invention noticed the fact that the NMOS transistor and the PMOS transistor differ in stress for contributing an improvement of operation current, as described above; examined portions of each active region to which a stress is remarkably applied; and thought out a technique of filling with two different kinds of insulating materials.

That is, in a first element isolation region of an STI element isolation region including a region neighboring a pair of opposed end faces of the active region of the PMOS transistor, i.e., a pair of end faces parallel to a channel width direction, a trench is filled up with an insulating material that gives the active region a compressive stress. Contrastingly, in a second element isolation region of the STI element isolation region as the region other than the first element isolation region, a trench is filled up with an insulating material that gives a tensile stress to each of the active regions of the N-type and P-type MOS transistors.

More specifically, in the case of a layout in which NMOS transistors and PMOS transistors are alternately arranged, the region between each pair of NMOS and PMOS transistors is considered to be a first element isolation region, where the trench is filled up with an insulating material that gives a compressive stress.

On the other hand, in the case of a layout in which an NMOS transistor group is constituted by a plurality of NMOS transistors arranged, and each PMOS transistor, and each PMOS transistor and the NMOS transistor group are formed in areas on a semiconductor substrate independent of each other, first element isolation regions are formed so as to sandwich each PMOS transistor.

In this case, dummy active regions are preferably formed at both ends of each PMOS transistor in order to make a flattening process sure when the trench in the first element isolation region is filled with an insulating material that gives a compressive stress.

On the other hand, also in the case of a layout in which such an NMOS transistor group as described above is constituted and a PMOS transistor group is constituted by a plurality of PMOS transistors arranged, and the PMOS transistor group and the NMOS transistor group are formed in areas on a semiconductor substrate independent of each other, first element isolation regions are likewise formed so as to sandwich each PMOS transistor.

Also in this case, dummy active regions are preferably formed at both ends of each PMOS transistor in order to make a flattening process sure when the trench in the first element isolation region is filled with an insulating material that gives a compressive stress.

By the above construction, without changing the structure of each transistor, compressive stresses can be given to the active region of each PMOS transistor only in channel length directions, while tensile stresses can be given to the other portions, that is, to the active region of each PMOS transistor in channel width directions and the active region of each NMOS transistor in both of channel length and width directions. Thus, according to the present invention, of course in the case of a construction including only N-type or P-type MOS transistors, even in the case of a construction in which N-type and P-type MOS transistors are formed on the same substrate, the optimum strain stress can be given to any of N-type and P-type MOS transistors without adding any extra manufacturing step after formation of STI element isolation structures.

Specific Embodiments to which the Invention is Applied

Hereinafter, based on the above-described fundamental essence, specific embodiments of the present invention in which the present invention is applied to CMOS transistors will be described with reference to drawings.

First Embodiment

In this embodiment, a case of a layout in which NMOS transistors and PMOS transistors are alternately arranged will be described, and for convenience's sake of explanation, the construction of a CMOS transistor will be described along its manufacturing process.

Figures 1A, 2:
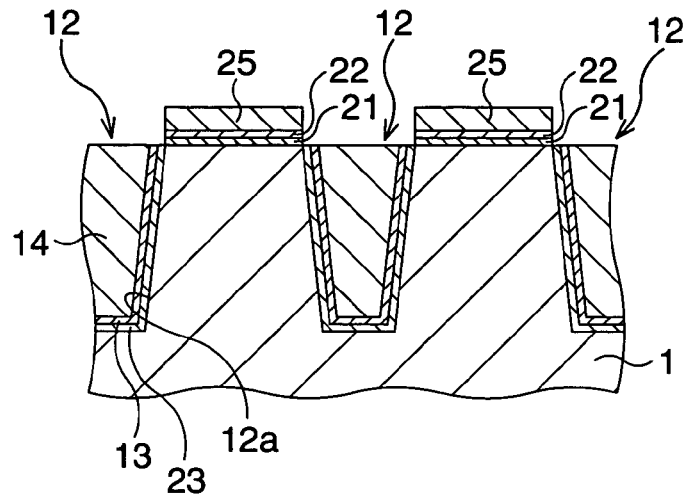
FIGS. 2-1A to 2-1C are schematic sectional views showing a manufacturing method of a CMOS transistor according to a first embodiment of the present invention, in the order of manufacturing steps.
Figures 1B, 2:
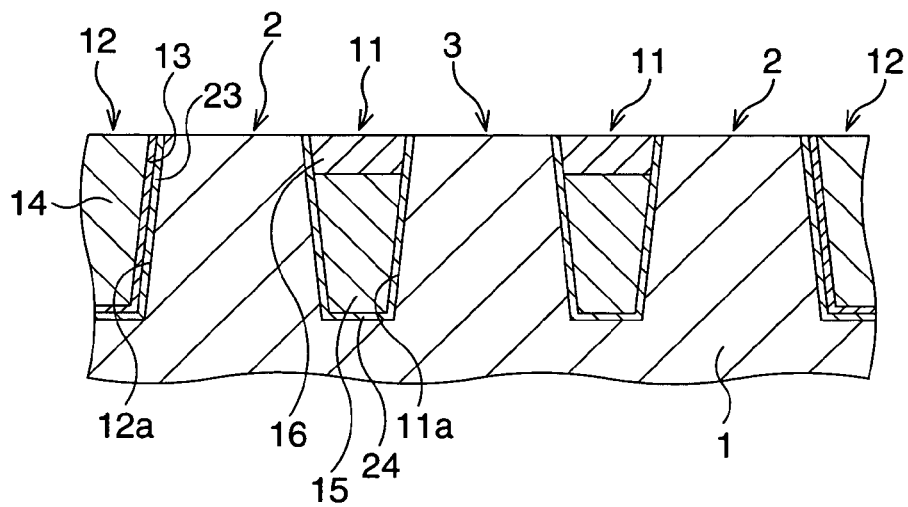
Figure 3:
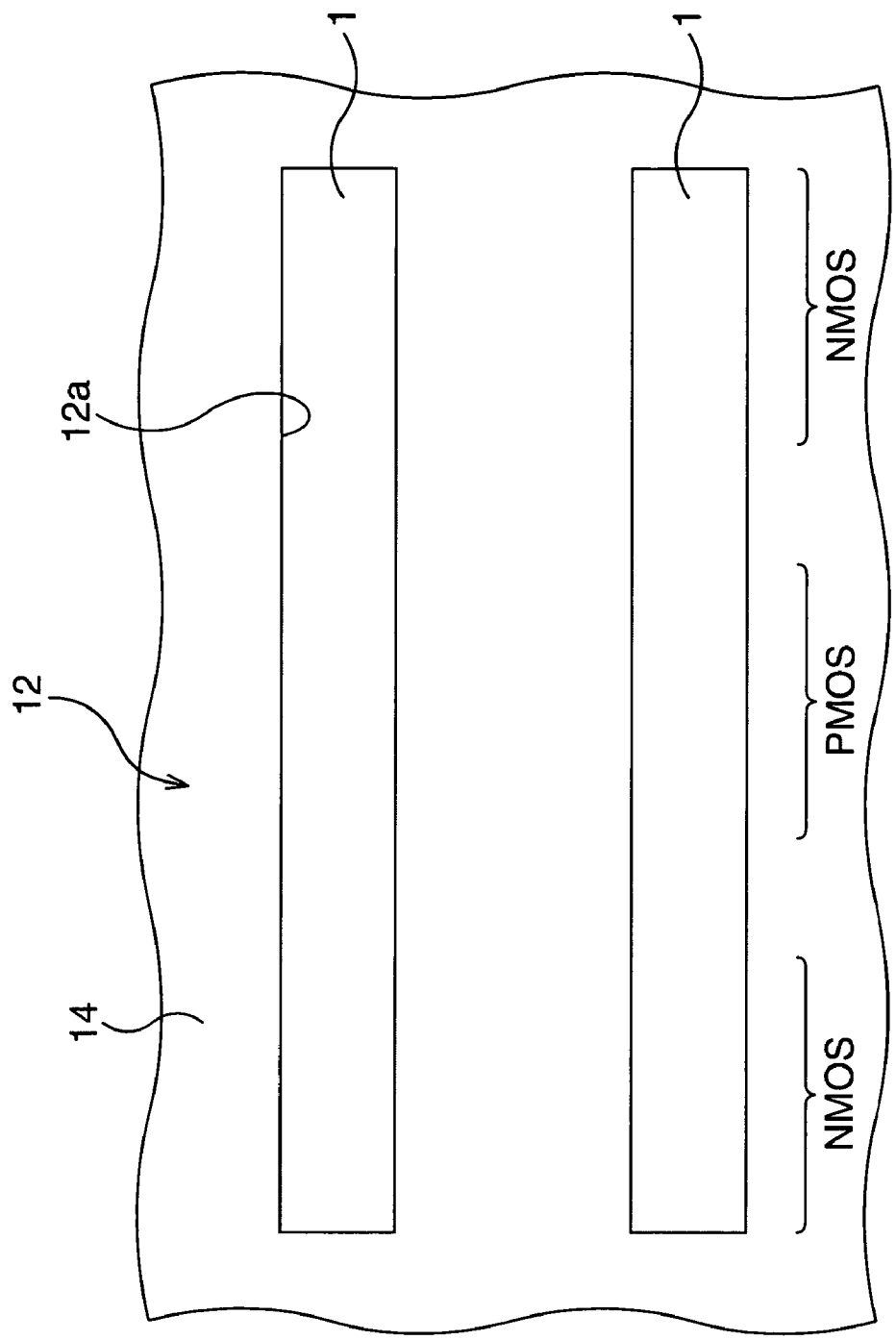
FIG. 3 is a schematic plan view showing a particularly principal step of the manufacturing method of the CMOS transistor according to the first embodiment.
Figure 4:
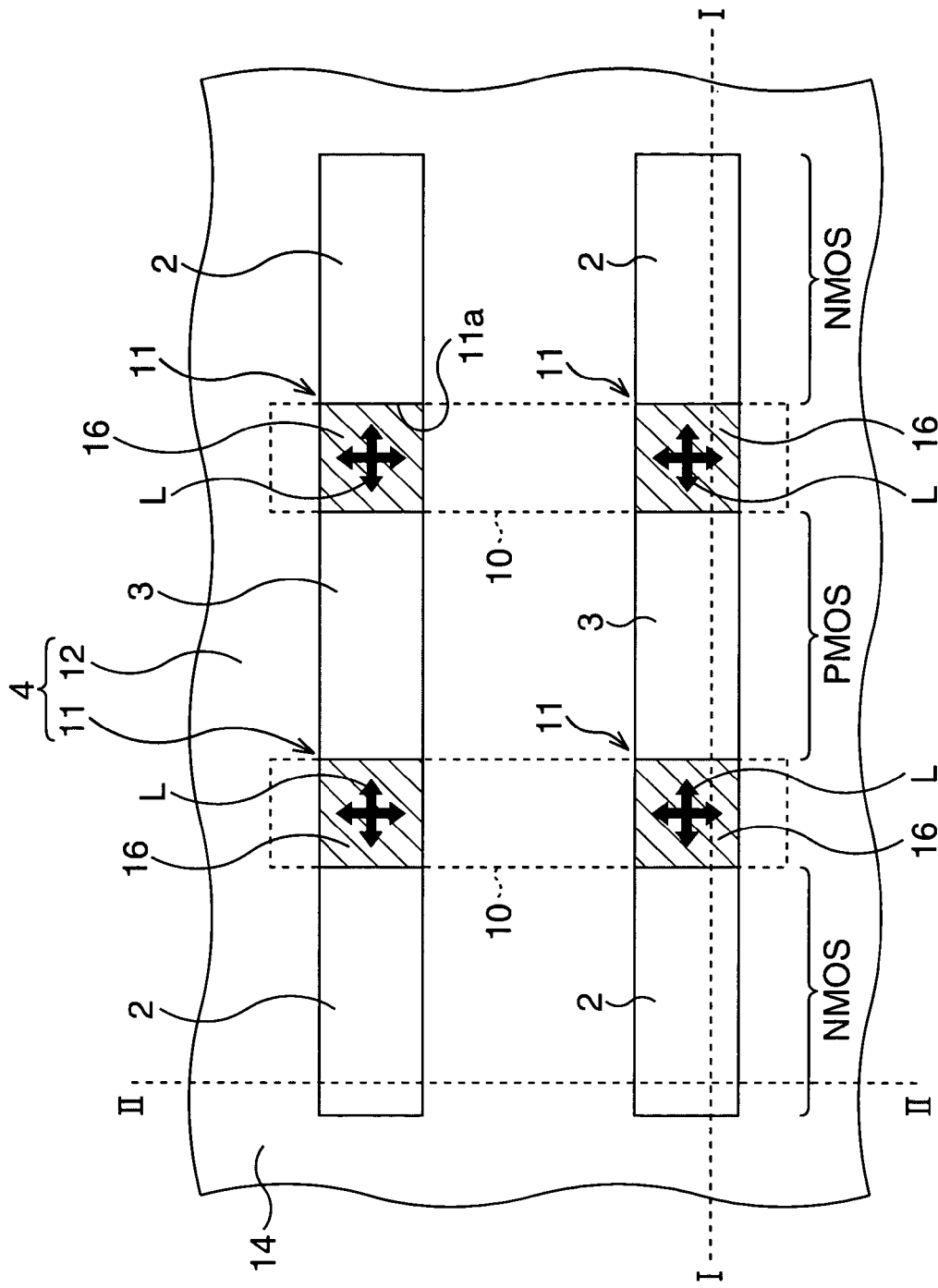
FIG. 4 is a schematic plan view showing a particularly principal step of the manufacturing method of the CMOS transistor according to the first embodiment.
Figure 5:
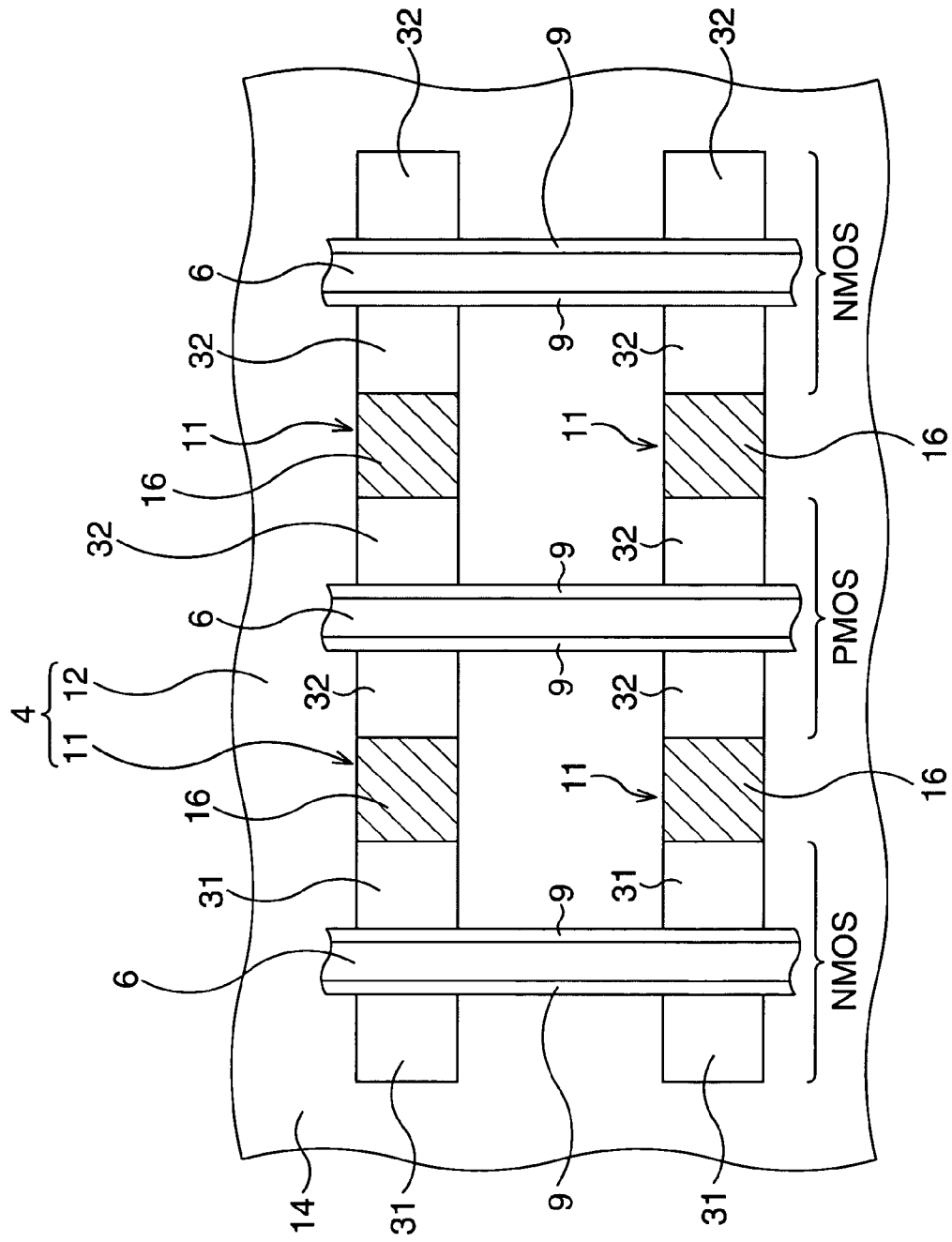
FIG. 5 is a schematic plan view showing the CMOS transistor completed.

FIGS. 2-1 and 2-2 are schematic sectional views showing a manufacturing method of a CMOS transistor according to this embodiment, in the order of manufacturing steps. FIGS. 3 and 4 are schematic plan views showing particularly principal steps of the manufacturing method of the CMOS transistor according to this embodiment. FIG. 5 is a schematic plan view showing the CMOS transistor completed. FIG. 6 shows schematic sectional views taken along broken lines I-I and II-II in FIG. 4, put in parallel. In FIGS. 2-1 and 2-2, FIG. 2-1A corresponds to the broken line II-II in FIG. 4, and FIGS. 2-1B, 2-1C, and 2-2A to 2-2C correspond to the broken line I-I in FIG. 4.

In FIGS. 3 to 5, a region where an NMOS transistor is to be formed is represented by NMOS, and a region where a PMOS transistor is to be formed is represented by PMOS. In this embodiment, an example in which a PMOS is interposed between NMOSs will be described. In this embodiment, an active region 2 of an NMOS transistor and an active region 3 of a PMOS transistor are divided by an STI element isolation structure 4. The STI element isolation structure 4 is made up of a first element isolation structure 11 formed in a first element isolation region between the active regions 2 and 3, and a second element isolation structure 12 formed in a second element isolation region other than the first element isolation region.

First, as shown in FIGS. 2-1A and 3, of the STI element isolation structure 4 for demarcating the active regions of the NMOS and PMOS transistors, the second element isolation structure 12 is formed on a silicon substrate 1.

More specifically, first, an about 10 nm-thick silicon oxide film 21 is formed on the entire surface of a semiconductor substrate, i.e., a silicon substrate 1 in this embodiment, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI (Shallow Trench Isolation) method, lithography and dry etching are applied to the second element isolation region of the element isolation region on the silicon substrate 1 to remove surface layers of the silicon nitride film 22, the silicon oxide film 21, and the silicon substrate 1 in the second element isolation region by using a resist pattern 25 as a mask, and thereby a trench 12a is formed.

Subsequently, the interior surface of the trench 12a is thermally oxidized to form a silicon oxide film 23. A liner nitride film 13 as a thin nitride film is then formed by a CVD method. In this embodiment, an example will be described in which the trench 12a is filled up with a sparse insulating material as an insulating material that gives tensile stresses to the active regions 2 and 3, for example, silicon oxide deposited at a temperature not more than its glass transition temperature, i.e., nano clustering silica (NCS) 14 in this embodiment. The same effect can be obtained even by using another material that contracts by itself. As the silicon oxide deposited at a temperature not more than its glass transition temperature, in place of the NCS 14, silicon oxide may be deposited by using TEOS. Afterward, by using the silicon nitride film 22 on the silicon substrate 1 as a stopper, the surface layer of the NCS 14 is flattened by chemical mechanical polishing (CMP) to leave the NCS 14 only in the trench 12a. At this time, the second element isolation structure 12 in which the trench 12a has been filled up with the NCS 14 is formed.

Subsequently, as shown in FIGS. 2-1B, 4, and 6, the first element isolation structure 11 is formed in the first element isolation region of the element isolation region on the silicon substrate 1.

More specifically, first, by the STI method, lithography and etching are applied to the first element isolation region to remove surface layers of the silicon nitride film 22, the silicon oxide film 21, and the silicon substrate 1, and thereby a belt-like trench 11a is formed. In this embodiment, the first element isolation region is patterned by baking a pattern 10 as shown by a broken line in FIG. 4 so as to be perpendicular to the surface layer of the silicon substrate 1 patterned into a belt shape.

Subsequently, the interior surface of the trench 11a is thermally oxidized to form a silicon oxide film 24. HDP oxide 15 by a high density plasma (HDP) CVD method as a dense insulating material that gives the active region 3 a compressive stress in a channel length direction, is deposited in the middle of the trench 11a so as not to completely fill up the trench 11a.

Subsequently, about 50 nm-thick amorphous or polycrystalline silicon, i.e., polycrystalline silicon (not shown) in this embodiment, is deposited at, for example, 650° C., by a CVD method to fill up the trench 11a. Afterward, by using the silicon nitride film 22 on the silicon substrate 1 as a stopper, a surface layer of the polycrystalline silicon is flattened by CMP to leave the polycrystalline silicon only in the trench 11a. Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 50 nm/0.46=about 108 nm, and thus the silicon oxide 16 serves as a dense insulating material that gives the active region 3 a compressive stress in a channel length direction. At this time, the first element isolation structure 11 in which the trench 11a has been filled up with the HDP oxide 15 and the silicon oxide 16 is formed. By the above, the STI element isolation structure 4 is completed that is made up of the first element isolation structure 11 formed in the first element isolation region and the second element isolation structure 12 formed in the second element isolation region other than the first element isolation structure 11.

Subsequently, the remaining silicon nitride film 22 and silicon oxide film 21 are removed by wet etching. At this time, in each NMOS, the first element isolation structure 11 is provided for only one of four sides and the other three sides are surrounded by the second element isolation structure 12 to demarcate the active region 2. Contrastingly, in each PMOS, the first element isolation structure 11 is provided for two of four sides parallel to a channel length direction and the second element isolation structure 12 is provided for two sides parallel to a channel width direction. The active region 3 is divided by thus being surrounded by the first and second element isolation structures 11 and 12.

Figures 1C, 2:
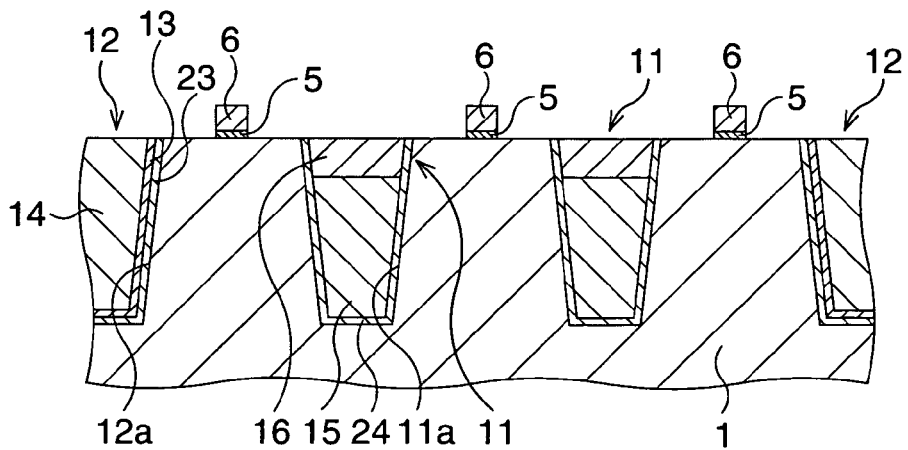

Subsequently, as shown in FIG. 2-1C, a gate electrode 6 is formed into a pattern on each of the active regions 2 and 3 with a gate insulating film 5 being interposed.

More specifically, first, an about 1.2 nm-thick gate insulating film 5 is formed on the active regions 2 and 3 by a thermal oxidation method. Afterward, an about 100 nm-thick polycrystalline silicon film is deposited on the gate insulating film 5 by a CVD method. The polycrystalline silicon film and the gate insulating film 5 are patterned into an electrode shape by lithography and dry etching to form a gate electrode 6 into a pattern on each of the active regions 2 and 3 with the gate insulating film 5 being interposed.

In this embodiment, the gate electrode 6 extends parallel to the first element isolation structure 11. Therefore, a gate length direction and a gate width direction correspond to a channel length direction and a channel width direction, respectively.

Figures 2, 2A:
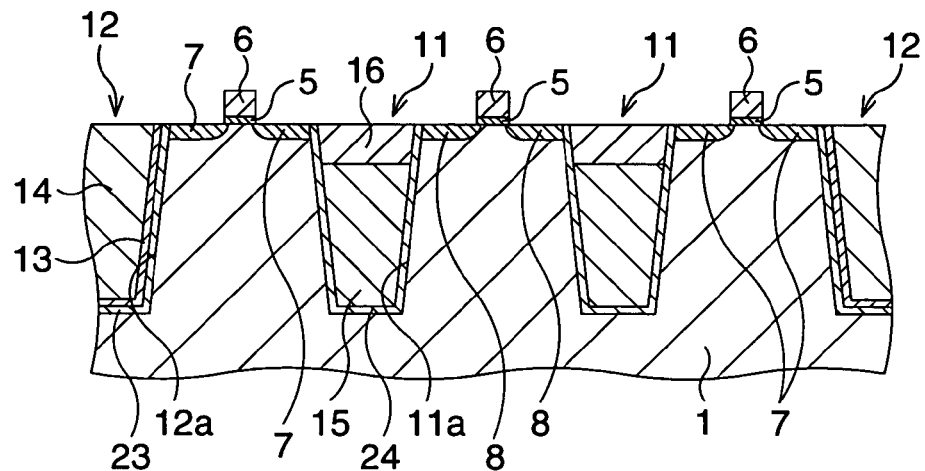

Subsequently, as shown in FIG. 2-2A, extension regions 7 and extension regions 8 are formed for the respective active regions 2 and 3.

More specifically, first, a resist mask (not shown) is formed to cover the active region 3. In this state, N-type impurities, i.e., arsenic (As) in this embodiment, are ion-implanted only into the active region 2 under the conditions of, for example, an acceleration energy of 5 keV and a doze of $1 \times 10^{15}/cm^2$. At this time, in the active region 3, the gate electrode 6 serves as a mask and thereby N-type extension regions 7 are formed on both sides of the gate electrode 6.

Subsequently, after the above resist mask is removed by ashing or the like, a resist mask (not shown) is formed to cover the active region 2. In this state, P-type impurities, i.e., boron (B) in this embodiment, are ion-implanted only into the active region 3 under the conditions of, for example, an acceleration energy of 0.5 keV and a doze of $1 \times 10^{15}/cm^2$. At this time, in the active region 2, the gate electrode 6 serves as a mask and thereby P-type extension regions 8 are formed on both sides of the gate electrode 6. Afterward, the above resist mask is removed by ashing or the like.

Figures 2, 2B:
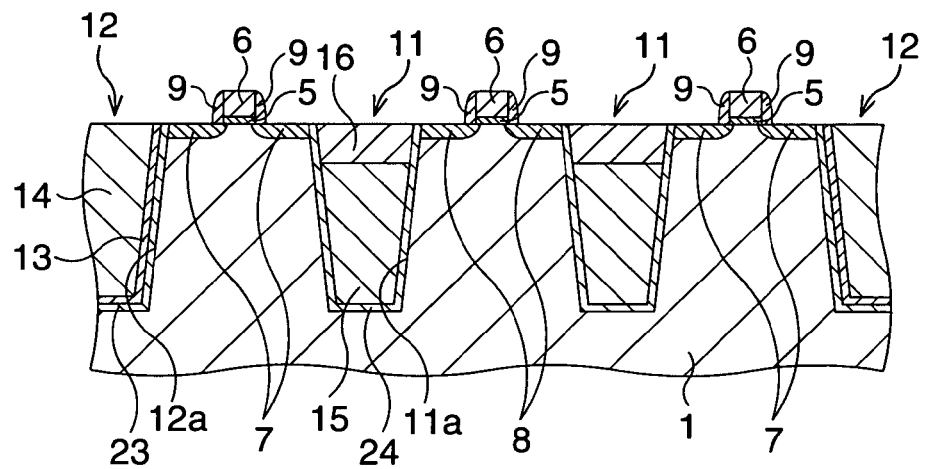

Subsequently, as shown in FIG. 2-2B, sidewall spacers 9 are formed on both side faces of the gate electrode 6 of each of the active regions 2 and 3.

More specifically, an insulating film, i.e., a silicon oxide film (not shown) in this embodiment, is deposited on the entire surface including the active regions 2 and 3. The entire surface of the silicon oxide film is anisotropically etched (etched back) to leave the silicon oxide film only on both side faces of the gate electrode 6 of each of the active regions 2 and 3, thereby forming sidewall spacers 9.

Figures 2, 2C:
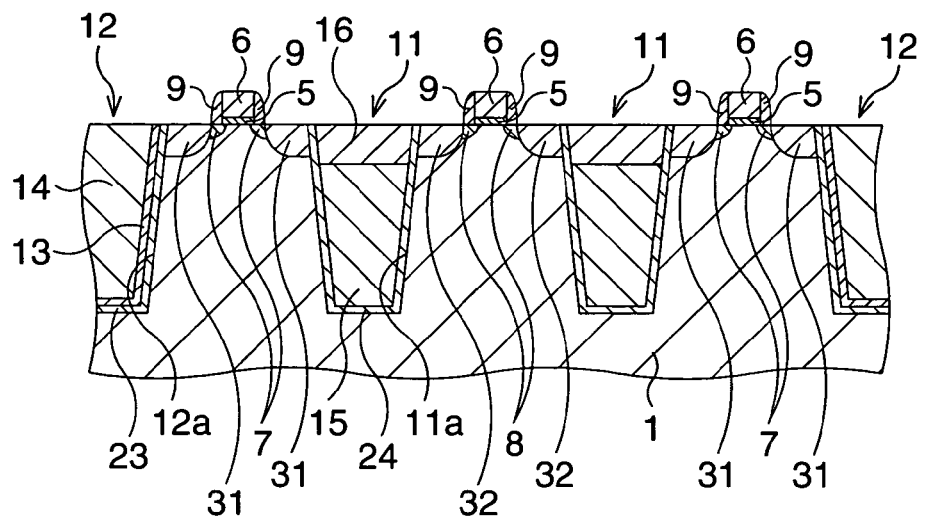

Subsequently, as shown in FIGS. 2-2C and 5, source/drain regions 31 are formed in the active region 2 while source/drain regions 32 are formed in the active region 3.

More specifically, first, a resist mask (not shown) is formed to cover the active region 3. In this state, N-type impurities, i.e., phosphorous (P) in this embodiment, are ion-implanted only into the active region 2 under the conditions of, for example, an acceleration energy of 20 keV and a doze of $5 \times 10^{15}/cm^2$. At this time, in the active region 2, the gate electrode 6 and the sidewall spacers 9 serve as a mask and thereby N-type source/drain regions 31 deeper than the extension regions 7 are formed on both sides of the sidewall spacers 9 to partially overlap the extension regions 7.

Subsequently, after the above resist mask is removed by ashing or the like, a resist mask (not shown) is formed to cover the active region 2. In this state, P-type impurities, i.e., boron (B) in this embodiment, are ion-implanted only into the active region 3 under the conditions of, for example, an acceleration energy of 5 keV and a doze of $4 \times 10^{15}/cm^2$. At this time, in the active region 3, the gate electrode 6 and the sidewall spacers 9 serve as a mask and thereby P-type source/drain regions 32 deeper than the extension regions 8 are formed on both sides of the sidewall spacers 9 to partially overlap the extension regions 8.

Afterward, through formation of insulating interlayers, various contact holes, and wiring, a CMOS transistor is completed that is made up of an NMOS transistor in each active region 2 and a PMOS transistor in each active region 3.

In this embodiment, in the active region 2 of NMOS, three sides are surrounded by the second element isolation structure 12, and the second element isolation structure 12 has been filled with the sparse NCS 14. Therefore, the three sides of the active region 2 are given tensile stresses that cause an improvement of the operation current of the NMOS transistor. Further, the liner nitride film 13 is provided in the second element isolation structure 12 to control stresses to the active region 2. Although one side of the active region 2 receives a compressive stress from the first element isolation structure 11, this does not so matter because the compressive stress is buffered by the tensile stresses on the other three sides and the stress control by the liner nitride film 13.

On the other hand, in the active region 3 of PMOS, the first element isolation structure 11 is provided for two sides parallel to a channel length direction, and the second element isolation structure 12 is provided for two sides parallel to a channel width direction. The first element isolation structure 11 has been filled with the dense HDP oxide 15 and the silicon oxide 16 obtained by oxidizing polycrystalline silicon. Therefore, the active region 3 is given stresses that cause an improvement of the operation current of the PMOS transistor, that is, two sides parallel to a channel length direction are given compressive stresses from the first element isolation structure 11 (as shown by arrows L in FIG. 4) while two sides parallel to a channel width direction are given tensile stresses from the second element isolation structure 12. Further, the liner nitride film 13 is provided in the second element isolation structure 12 to control stresses to the active region 3 in channel width directions.

As described above, according to this embodiment, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 4.

(Modification)

A modification of the first embodiment will be described. In this modification will be described a case of a layout in which NMOS transistors and PMOS transistors are alternately arranged, like the first embodiment. However, part of the formation process of the STI element isolation structure and some of the insulating materials to fill are different from those of the first embodiment. The same components as in the first embodiment are denoted by the same reference numerals as in the first embodiment.

Figure 7:
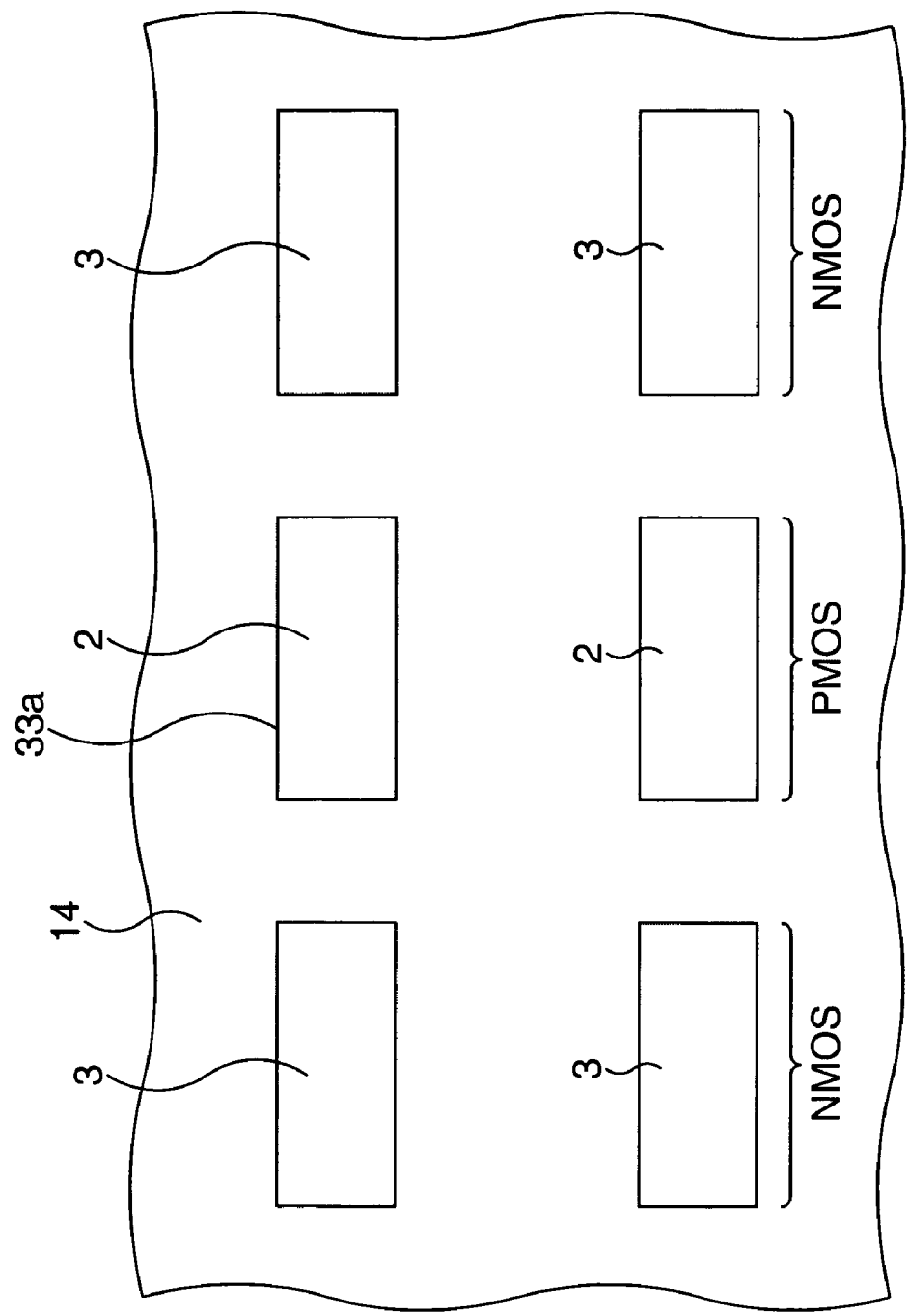
FIG. 7 is a schematic plan view showing a particularly principal step of a manufacturing method of a CMOS transistor according to a modification of the first embodiment.
Figure 8:
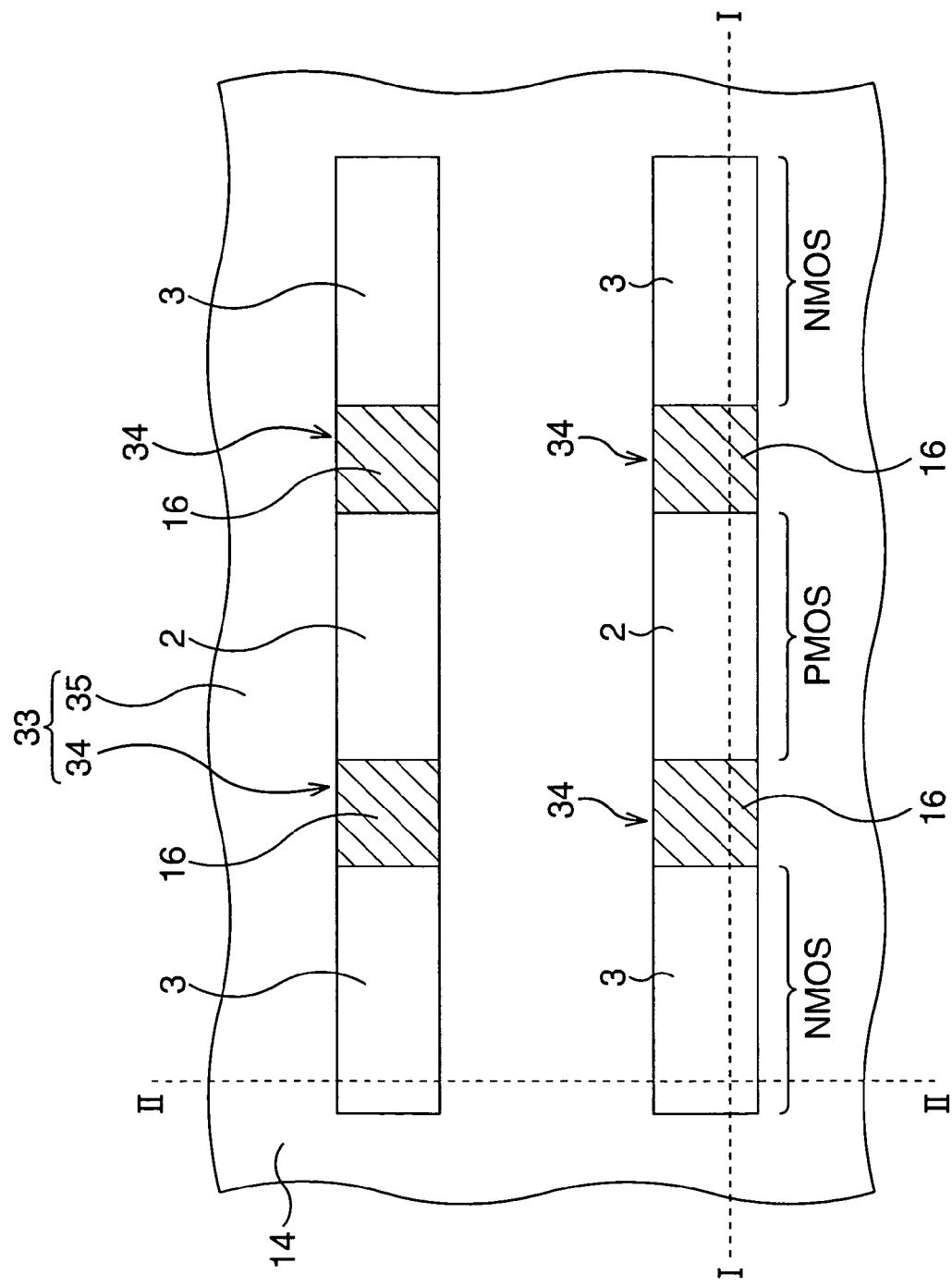
FIG. 8 is a schematic plan view showing a particularly principal step of the manufacturing method of the CMOS transistor according to the modification of the first embodiment.

FIGS. 7 and 8 are schematic plan views showing particularly principal steps of a manufacturing method of a CMOS transistor according to this modification. FIG. 9 shows schematic sectional views taken along broken lines I-I and II-II in FIG. 8, put in parallel.

In FIGS. 7 and 8, a region where an NMOS transistor is to be formed is represented by NMOS, and a region where a PMOS transistor is to be formed is represented by PMOS. In this modification, an example in which a PMOS is interposed between NMOSs will be described. In this modification, an active region 2 of an NMOS transistor and an active region 3 of a PMOS transistor are divided by an STI element isolation structure 33. The STI element isolation structure 33 is made up of a first element isolation structure 34 formed in a first element isolation region between the active regions 2 and 3, and a second element isolation structure 35 formed in a second element isolation region other than the first element isolation region.

In this modification, first, as shown in FIG. 7, a trench 33a of the STI element isolation structure 33 for demarcating the active regions of the NMOS and PMOS transistors is formed on a silicon substrate 1, and then the trench 33a is filled up with NCS 14 as an insulating material for the second element isolation structure 35.

More specifically, first, like in FIG. 2-1A, an about 10 nm-thick silicon oxide film 21 is formed on the entire surface of a semiconductor substrate, i.e., a silicon substrate 1 in this modification, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI method, lithography and dry etching are applied to the element isolation region on the silicon substrate 1 to remove surface layers of the silicon nitride film 22, the silicon oxide film 21, and the silicon substrate 1 in the element isolation region, and thereby a trench 33a is formed.

Subsequently, the interior surface of the trench 33a is thermally oxidized to form a silicon oxide film 23. A liner nitride film 13 as a thin nitride film is then formed by a CVD method. The trench 33a is filled up with a sparse insulating material as an insulating material that gives tensile stresses to the active regions 2 and 3, for example, silicon oxide deposited at a temperature not more than its glass transition temperature, i.e., NCS 14 in this modification. As the silicon oxide deposited at a temperature not more than its glass transition temperature, in place of the NCS 14, silicon oxide may be deposited by using TEOS. Afterward, by using the silicon nitride film 22 as a stopper, the surface layer of the NCS 14 is flattened by CMP to leave the NCS 14 only in the trench 33a.

Subsequently, as shown in FIGS. 8 and 9, the first element isolation structure 34 is formed in the first element isolation region of the element isolation region on the silicon substrate 1, and the second element isolation structure 35 is formed.

More specifically, first, lithography and etching are applied to a portion of the silicon nitride film 22 in the trench 33a corresponding to the first element isolation region to remove only surface layers of the NCS 14, liner nitride film 13, and silicon oxide film 23 of that portion, and thereby a trench 34a is formed. In the case that the trench 33a has its depth of about 400 nm, the quantity of the above removal is controlled to about 100 nm. In this case, therefore, the trench 34a has its depth of about 100 nm.

Subsequently, the interior surface of the trench 34a is thermally oxidized to form a silicon oxide film 24. Afterward, about 100 nm-thick amorphous or polycrystalline silicon, i.e., polycrystalline silicon (not shown) in this modification, is deposited at, for example, 650° C., by a CVD method to fill up the trench 34a. Afterward, by using the silicon nitride film 22 on the silicon substrate 1 as a stopper, a surface layer of the polycrystalline silicon is flattened by CMP to leave the polycrystalline silicon only in the trench 34a.

Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 100 nm/0.46=about 216 nm, and thus the silicon oxide 16 serves as a dense insulating material that gives the active region 3 a compressive stress in a channel length direction. At this time, the first element isolation structure 34 in which the trench 34a has been filled up with the NCS 14 and the silicon oxide 16 is formed. Simultaneously with this, the second element isolation structure 35 in which the trench 35a has been filled up with the NCS 14 is formed. By the above, the STI element isolation structure 33 is completed that is made up of the first element isolation structure 34 formed in the first element isolation region and the second element isolation structure 35 formed in the second element isolation region other than the first element isolation structure 34.

Subsequently, the remaining silicon nitride film 22 and silicon oxide film 21 are removed by wet etching. At this time, in each NMOS, the first element isolation structure 34 is provided for only one of four sides and the other three sides are surrounded by the second element isolation structure 35 to demarcate the active region 2. Contrastingly, in each PMOS, the first element isolation structure 34 is provided for two of four sides parallel to a channel length direction and the second element isolation structure 35 is provided for two sides parallel to a channel width direction. The active region 3 is divided by thus being surrounded by the first and second element isolation structures 34 and 35.

Afterward, through manufacturing steps like in FIGS. 2-1C and 2-2A to 2-2C and desired subsequent steps, a CMOS transistor is completed that is made up of an NMOS transistor in each active region 2 and a PMOS transistor in each active region 3.

In this modification, in the active region 2 of NMOS, three sides are surrounded by the second element isolation structure 35, and the second element isolation structure 35 has been filled with the sparse NCS 14. Therefore, the three sides of the active region 2 are given tensile stresses that cause an improvement of the operation current of the NMOS transistor. Further, the liner nitride film 13 is provided in the second element isolation structure 35 to control stresses to the active region 2. Although one side of the active region 2 receives a compressive stress from the first element isolation structure 34, this does not so matter because the compressive stress is buffered by the tensile stresses on the other three sides and the stress control by the liner nitride film 13.

On the other hand, in the active region 3 of PMOS, the first element isolation structure 34 is provided for two sides parallel to a channel length direction, and the second element isolation structure 35 is provided for two sides parallel to a channel width direction. The upper layer portion of the first element isolation structure 34 has been filled with the dense silicon oxide 16. Therefore, the active region 3 is given stresses that cause an improvement of the operation current of the PMOS transistor, that is, two sides parallel to a channel length direction are given compressive stresses from the first element isolation structure 34 while two sides parallel to a channel width direction are given tensile stresses from the second element isolation structure 35. Further, the liner nitride film 13 is provided in the second element isolation structure 35 to control stresses to the active region 3 in channel width directions.

As described above, according to this modification, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 33.

Second Embodiment

A second embodiment of the present invention will be described. In this embodiment will be described a case of a layout in which an NMOS transistor group is constituted by a plurality of NMOS transistors arranged, and each PMOS transistor and the NMOS transistor group are formed in areas on a silicon substrate independent of each other. The same components as in the first embodiment are denoted by the same reference numerals as in the first embodiment.

Figure 10:
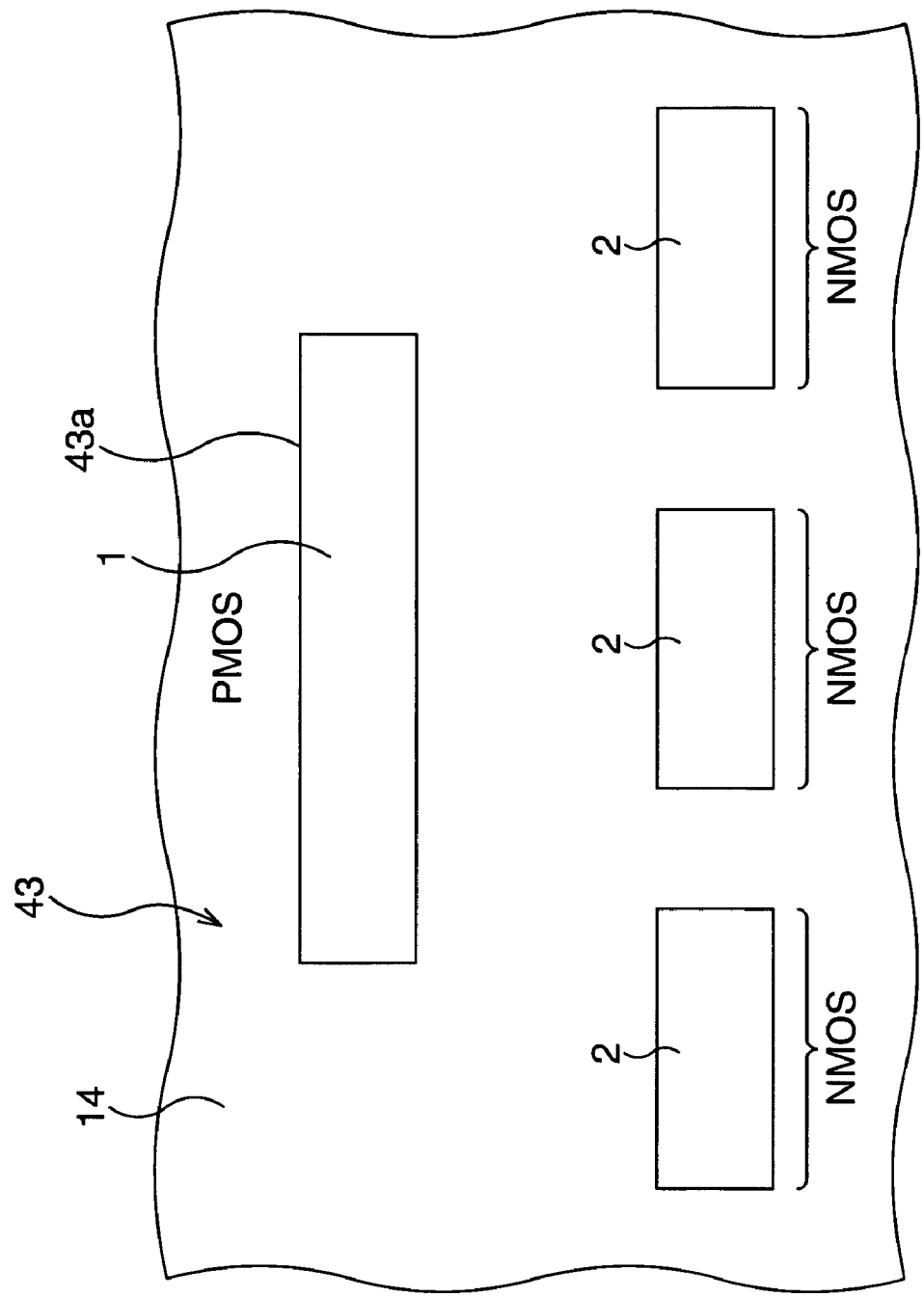
FIG. 10 is a schematic plan view showing a particularly principal step of a manufacturing method of a CMOS transistor according to a second embodiment of the present invention.
Figure 11:
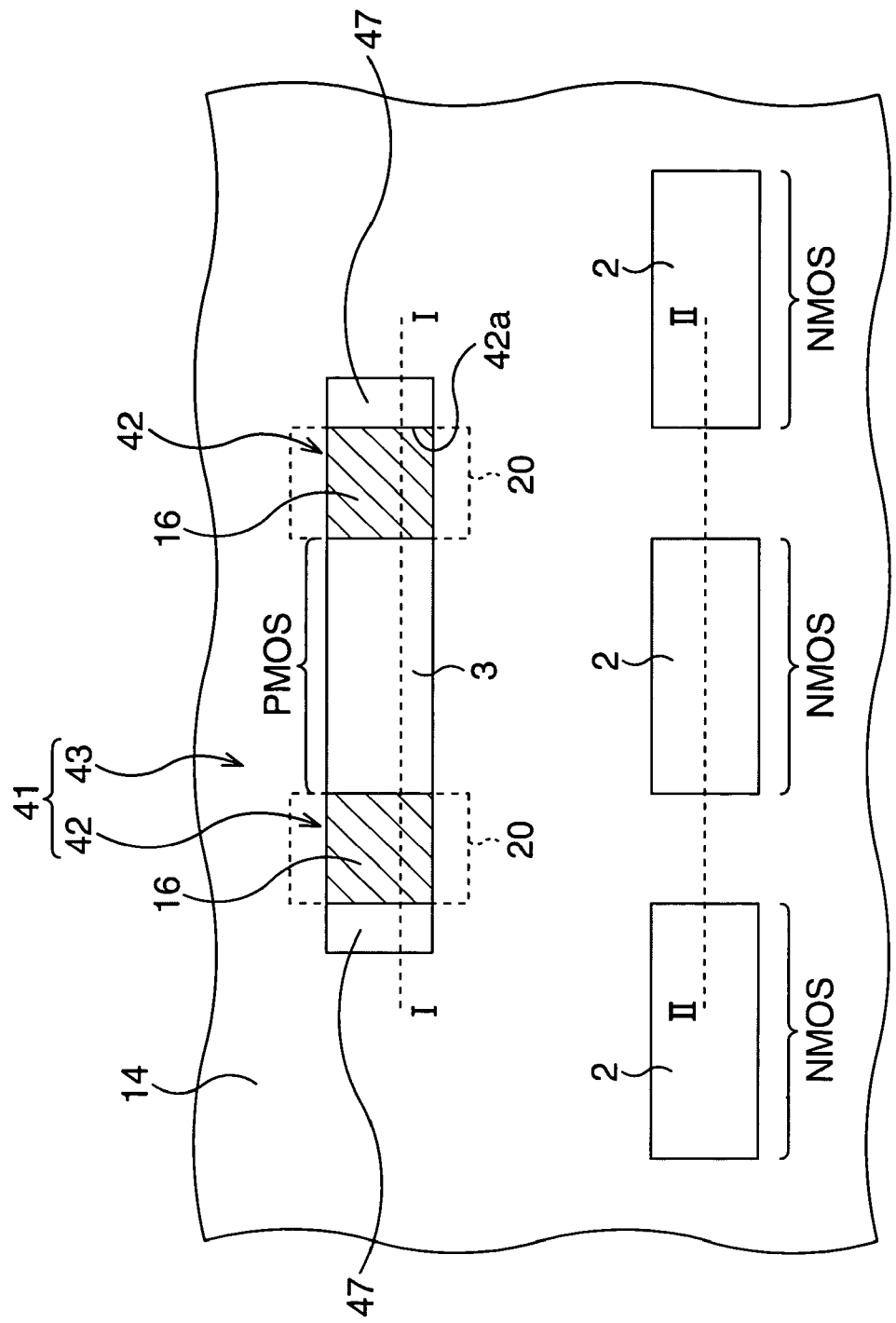
FIG. 11 is a schematic plan view showing a particularly principal step of the manufacturing method of the CMOS transistor according to the second embodiment.

FIGS. 10 and 11 are schematic plan views showing particularly principal steps of a manufacturing method of a CMOS transistor according to this embodiment. FIG. 12 shows schematic sectional views taken along broken lines I-I and II-II in FIG. 11, put in parallel.

In FIGS. 10 and 11, a region where an NMOS transistor is to be formed is represented by NMOS, and a region where a PMOS transistor is to be formed is represented by PMOS. In this embodiment will be described an example in which an NMOS transistor group (three NMOS transistors are arranged in FIGS. 10 and 11) and each PMOS transistor (one PMOS transistor is shown in FIGS. 10 and 11) are formed in areas on a silicon substrate 1 independent of each other. In this embodiment, an active region 2 of an NMOS transistor and an active region 3 of a PMOS transistor are divided by an STI element isolation structure 41. The STI element isolation structure 41 is made up of a first element isolation structure 42 formed in a first element isolation region sandwiching therein the active region 3 in a channel length direction, and a second element isolation structure 43 formed in a second element isolation region other than the first element isolation region.

First, as shown in FIG. 10, of the STI element isolation structure 41 for demarcating the active regions of the NMOS and PMOS transistors, the second element isolation structure 43 is formed on a silicon substrate 1.

More specifically, first, like in FIG. 2-1A, an about 10 nm-thick silicon oxide film 21 is formed on the entire surface of a semiconductor substrate, i.e., a silicon substrate 1 in this embodiment, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI method, lithography and dry etching are applied to the second element isolation region of the element isolation region on the silicon substrate 1 to remove surface layers of the silicon nitride film 22, the silicon oxide film 21, and the silicon substrate 1 in the second element isolation region, and thereby a trench 43a is formed.

Subsequently, the interior surface of the trench 43a is thermally oxidized to form a silicon oxide film 23. A liner nitride film 13 as a thin nitride film is then formed by a CVD method. The trench 43a is filled up with a sparse insulating material as an insulating material that gives tensile stresses to the active regions 2 and 3, for example, silicon oxide deposited at a temperature not more than its glass transition temperature, i.e., nano clustering silica (NCS) 14 in this embodiment. As the silicon oxide deposited at a temperature not more than its glass transition temperature, in place of the NCS 14, silicon oxide may be deposited by using TEOS. Afterward, by using the silicon nitride film 22 on the silicon substrate 1 as a stopper, the surface layer of the NCS 14 is flattened by CMP to leave the NCS 14 only in the trench 43a. At this time, the second element isolation structure 43 in which the trench 43*a* has been filled up with the NCS 14 is formed.

Subsequently, as shown in FIGS. 11 and 12, the first element isolation structure 42 is formed in the first element isolation region of the element isolation region on the silicon substrate 1.

More specifically, first, by the STI method, lithography and etching are applied to the first element isolation region to remove surface layers of the silicon nitride film 22, the silicon oxide film 21, and the silicon substrate 1, and thereby a rectangular trench 42*a* is formed. In this embodiment, the first element isolation region is patterned by baking a pattern 20 as shown by a broken line in FIG. 11 so as to be perpendicular to the surface layer of the silicon substrate 1 patterned. The trench 42*a* is formed so that some part of the silicon substrate 1 remains at either end of each PMOS. Dummy active regions 47 are thereby formed at both ends of each PMOS.

Subsequently, the interior surface of the trench 42*a* is thermally oxidized to form a silicon oxide film 24. HDP oxide 15 by an HDP-CVD method as a dense insulating material that gives the active region 3 a compressive stress in a channel length direction, is deposited in the middle of the trench 42*a* so as not to completely fill up the trench 42*a*.

Subsequently, about 50 nm-thick amorphous or polycrystalline silicon, i.e., polycrystalline silicon (not shown) in this embodiment, is deposited at, for example, 650° C., by a CVD method to fill up the trench 42*a*. Afterward, by using the silicon nitride film 22 on the silicon substrate 1 as a stopper, a surface layer of the polycrystalline silicon is flattened by CMP to leave the polycrystalline silicon only in the trench 42*a*. In this CMP process, because the dummy active regions 47 exist at both ends of each PMOS, the surface layer of the polycrystalline silicon can be flattened accurately and surely.

Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 50 nm/0.46=about 108 nm, and thus the silicon oxide 16 serves as a dense insulating material that gives the active region 3 a compressive stress in a channel length direction. At this time, the first element isolation structure 42 in which the trench 42*a* has been filled up with the HDP oxide 15 and the silicon oxide 16 is formed. By the above, the STI element isolation structure 41 is completed that is made up of the first element isolation structure 42 formed in the first element isolation region and the second element isolation structure 43 formed in the second element isolation region other than the first element isolation structure 42.

Subsequently, the remaining silicon nitride film 22 and silicon oxide film 21 are removed by wet etching. At this time, in each NMOS, its four sides are surrounded by the second element isolation structure 43 to demarcate the active region 2. Contrastingly, in each PMOS, the first element isolation structure 42 is provided for two of four sides parallel to a channel length direction and the second element isolation structure 43 is provided for two sides parallel to a channel width direction. The active region 3 is divided by thus being surrounded by the first and second element isolation structures 42 and 43.

Afterward, through manufacturing steps like in FIGS. 2-1C and 2-2A to 2-2C of the first embodiment and desired subsequent steps, a CMOS transistor is completed that is made up of an NMOS transistor in each active region 2 and a PMOS transistor in each active region 3.

In this embodiment, in the active region 2 of NMOS, its four sides are surrounded by the second element isolation structure 43, and the second element isolation structure 43 has been filled with the sparse NCS 14. Therefore, the four sides of the active region 2 are given tensile stresses that cause an improvement of the operation current of the NMOS transistor. Further, the liner nitride film 13 is provided in the second element isolation structure 43 to control stresses to the active region 2.

On the other hand, in the active region 3 of PMOS, the first element isolation structure 42 is provided for two sides parallel to a channel length direction, and the second element isolation structure 43 is provided for two sides parallel to a channel width direction. The first element isolation structure 42 has been filled with the dense HDP oxide 15 and the silicon oxide 16 obtained by oxidizing polycrystalline silicon. Therefore, the active region 3 is given stresses that cause an improvement of the operation current of the PMOS transistor, that is, two sides parallel to a channel length direction are given compressive stresses from the first element isolation structure 42 while two sides parallel to a channel width direction are given tensile stresses from the second element isolation structure 43. Further, the liner nitride film 13 is provided in the second element isolation structure 43 to control stresses to the active region 3 in channel width directions.

As described above, according to this embodiment, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 41.

(Modification)

A modification of the second embodiment will be described. In this modification will be described a case of a layout in which an NMOS transistor group is constituted by a plurality of NMOS transistors arranged, and each PMOS transistor and the NMOS transistor group are formed in areas on a silicon substrate independent of each other, like the second embodiment. However, part of the formation process of the STI element isolation structure and some of the insulating materials to fill are different from those of the second embodiment. The same components as in the second embodiment are denoted by the same reference numerals as in the second embodiment.

Figure 13:
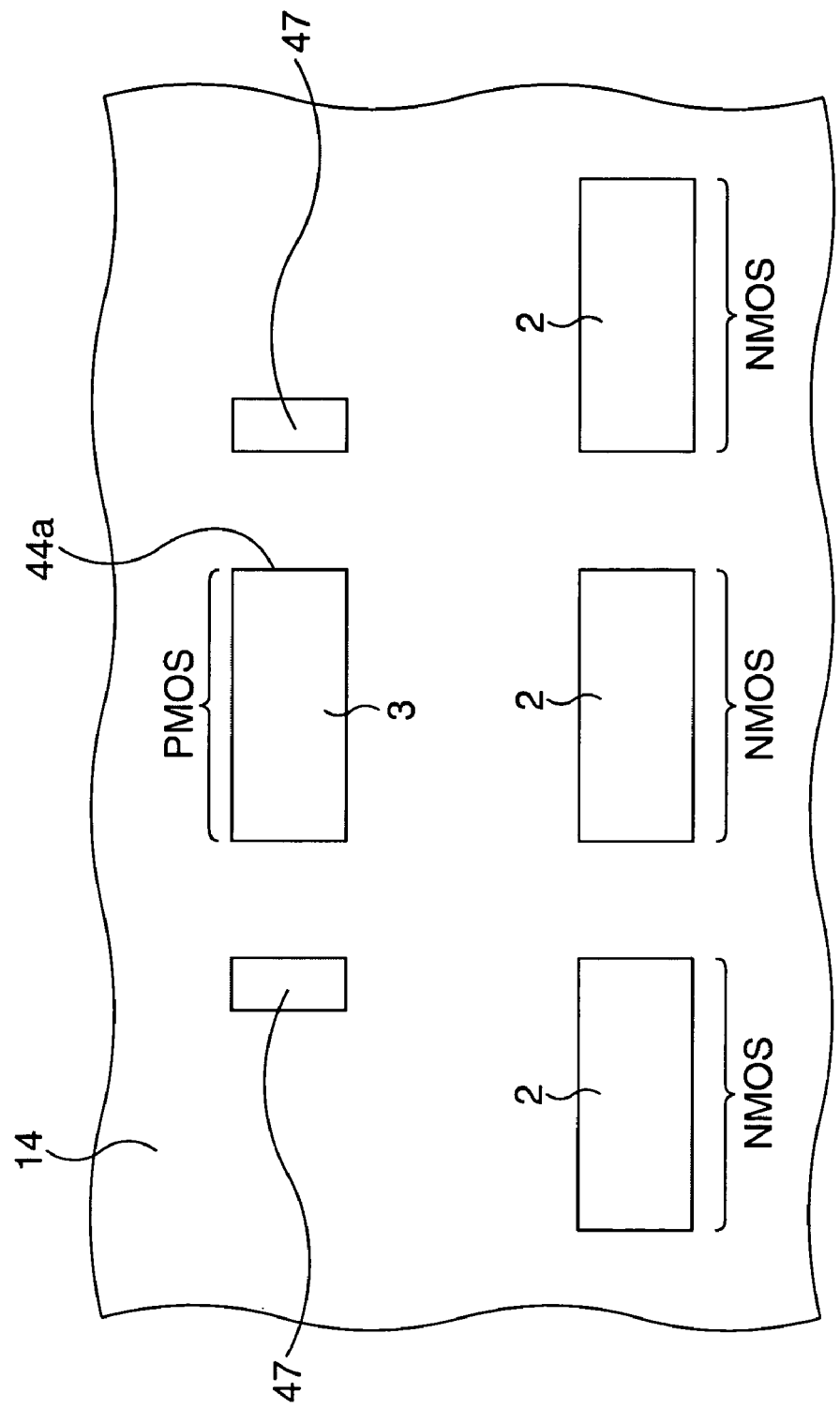
FIG. 13 is a schematic plan view showing a particularly principal step of a manufacturing method of a CMOS transistor according to a modification of the second embodiment.
Figure 14:
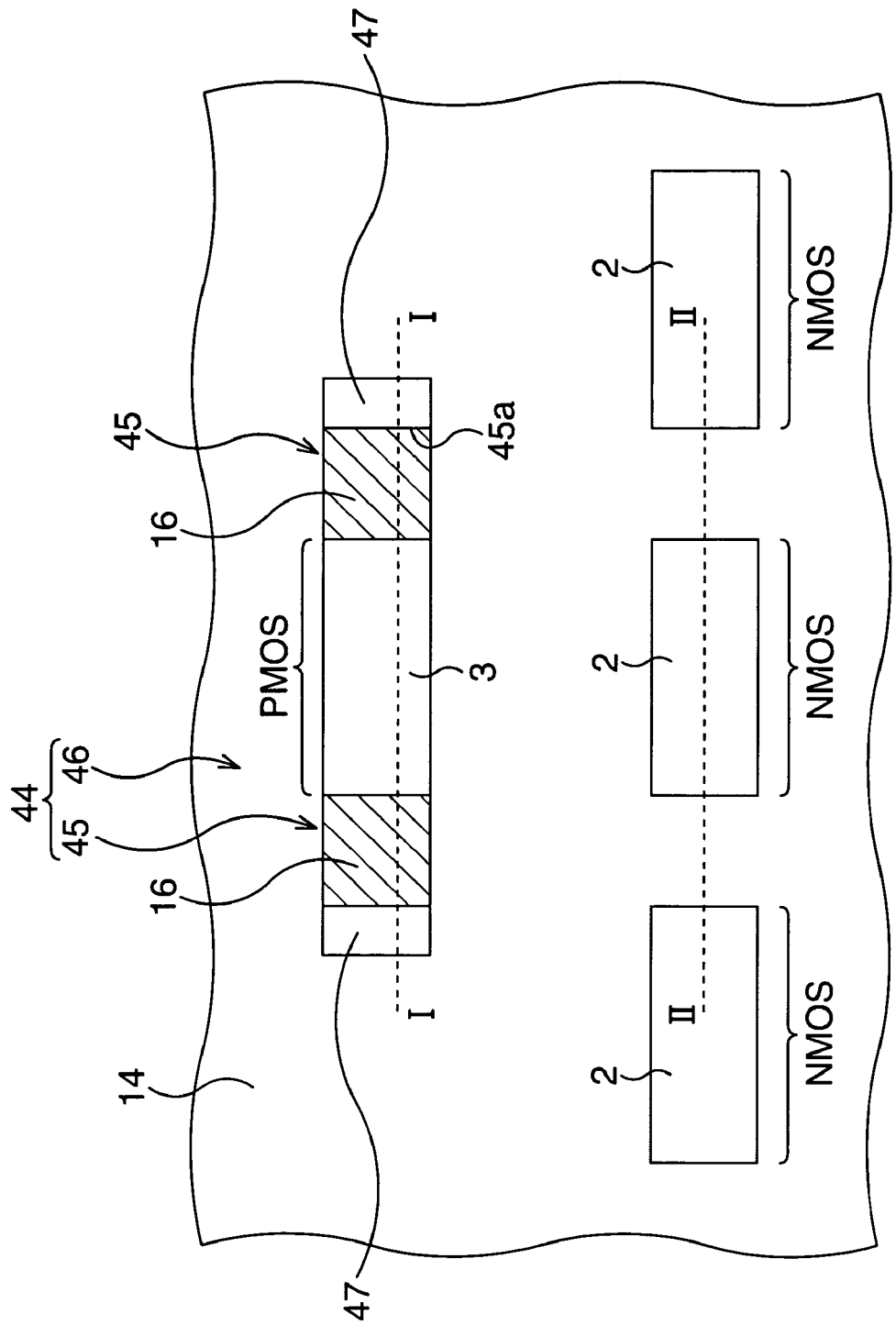
FIG. 14 is a schematic plan view showing a particularly principal step of the manufacturing method of the CMOS transistor according to the modification of the second embodiment.

FIGS. 13 and 14 are schematic plan views showing particularly principal steps of a manufacturing method of a CMOS transistor according to this modification. FIG. 15 shows schematic sectional views taken along broken lines I-I and II-II in FIG. 14, put in parallel.

In FIGS. 13 and 14, a region where an NMOS transistor is to be formed is represented by NMOS, and a region where a PMOS transistor is to be formed is represented by PMOS. In this modification will be described an example in which an NMOS transistor group (three NMOS transistors are arranged in FIGS. 13 and 14) and each PMOS transistor (one PMOS transistor is shown in FIGS. 13 and 14) are formed in areas on a silicon substrate 1 independent of each other. In this modification, an active region 2 of an NMOS transistor and an active region 3 of a PMOS transistor are divided by an STI element isolation structure 44. The STI element isolation structure 44 is made up of a first element isolation structure 45 formed in a first element isolation region sandwiching therein the active region 3 in a channel length direction, and a second element isolation structure 46 formed in a second element isolation region other than the first element isolation region.

In this modification, first, as shown in FIG. 13, a trench 44*a* of the STI element isolation structure 44 for demarcating the active regions of the NMOS and PMOS transistors is formed on a silicon substrate 1, and then the trench 44a is filled up with NCS 14 as an insulating material for the second element isolation structure 46.

More specifically, first, like in FIG. 2-1A, an about 10 nm-thick silicon oxide film 21 is formed on the entire surface of a semiconductor substrate, i.e., a silicon substrate 1 in this modification, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI method, lithography and dry etching are applied to the element isolation region on the silicon substrate 1 to remove surface layers of the silicon nitride film 22, the silicon oxide film 21, and the silicon substrate 1 in the element isolation region, and thereby a trench 44a is formed.

Subsequently, the interior surface of the trench 44a is thermally oxidized to form a silicon oxide film 23. A liner nitride film 13 as a thin nitride film is then formed by a CVD method. The trench 44a is filled up with a sparse insulating material as an insulating material that gives tensile stresses to the active regions 2 and 3, for example, silicon oxide deposited at a temperature not more than its glass transition temperature, i.e., NCS 14 in this modification. As the silicon oxide deposited at a temperature not more than its glass transition temperature, in place of the NCS 14, silicon oxide may be deposited by using TEOS. Afterward, by using the silicon nitride film 22 as a stopper, the surface layer of the NCS 14 is flattened by CMP to leave the NCS 14 only in the trench 44a.

Subsequently, as shown in FIGS. 14 and 15, the first element isolation structure 45 is formed in the first element isolation region of the element isolation region on the silicon substrate 1, and the second element isolation structure 46 is formed.

More specifically, first, lithography and etching are applied to a portion of the silicon nitride film 22 in the trench 44a corresponding to the first element isolation region to remove only surface layers of the NCS 14, liner nitride film 13, and silicon oxide film 23 of that portion, and thereby a rectangular trench 45a is formed. In the case that the trench 44a has its depth of about 400 nm, the quantity of the above removal is controlled to about 100 nm. In this case, therefore, the trench 45a has its depth of about 100 nm. In this modification, the trench 45a is formed so that some part of the silicon substrate 1 remains at either end of each PMOS. Dummy active regions 47 are thereby formed at both ends of each PMOS.

Subsequently, the interior surface of the trench 45a is thermally oxidized to form a silicon oxide film 24. Afterward, about 100 nm-thick amorphous or polycrystalline silicon, i.e., polycrystalline silicon (not shown) in this modification, is deposited at, for example, 650° C., by a CVD method to fill up the trench 45a. Afterward, by using the silicon nitride film 22 on the silicon substrate 1 as a stopper, a surface layer of the polycrystalline silicon is flattened by CMP to leave the polycrystalline silicon only in the trench 45a. In this CMP process, because the dummy active regions 47 exist at both ends of each PMOS, the surface layer of the polycrystalline silicon can be flattened accurately and surely.

Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 100 nm/0.46=about 216 nm, and thus the silicon oxide 16 serves as a dense insulating material that gives the active region 3 a compressive stress in a channel length direction. At this time, the first element isolation structure 45 in which the trench 45a has been filled up with the NCS 14 and the silicon oxide 16 is formed. Simultaneously with this, the second element isolation structure 46 in which the trench 46a has been filled up with the NCS 14 is formed. By the above, the STI element isolation structure 44 is completed that is made up of the first element isolation structure 45 formed in the first element isolation region and the second element isolation structure 46 formed in the second element isolation region other than the first element isolation structure 45.

Subsequently, the remaining silicon nitride film 22 and silicon oxide film 21 are removed by wet etching. At this time, in each NMOS, its four sides are surrounded by the second element isolation structure 46 to demarcate the active region 2. Contrastingly, in each PMOS, the first element isolation structure 45 is provided for two of four sides parallel to a channel length direction and the second element isolation structure 46 is provided for two sides parallel to a channel width direction. The active region 3 is divided by thus being surrounded by the first and second element isolation structures 45 and 46.

Afterward, through manufacturing steps like in FIGS. 2-1C and 2-2A to 2-2C, a CMOS transistor is completed that is made up of an NMOS transistor in each active region 2 and a PMOS transistor in each active region 3.

In this modification, in the active region 2 of NMOS, its four sides are surrounded by the second element isolation structure 46, and the second element isolation structure 46 has been filled with the sparse NCS 14. Therefore, the four sides of the active region 2 are given tensile stresses that cause an improvement of the operation current of the NMOS transistor. Further, the liner nitride film 13 is provided in the second element isolation structure 46 to control stresses to the active region 2.

On the other hand, in the active region 3 of PMOS, the first element isolation structure 45 is provided for two sides parallel to a channel length direction, and the second element isolation structure 46 is provided for two sides parallel to a channel width direction. The upper layer portion of the first element isolation structure 45 has been filled with the dense silicon oxide 16. Therefore, the active region 3 is given stresses that cause an improvement of the operation current of the PMOS transistor, that is, two sides parallel to a channel length direction are given compressive stresses from the first element isolation structure 45 while two sides parallel to a channel width direction are given tensile stresses from the second element isolation structure 46. Further, the liner nitride film 13 is provided in the second element isolation structure 46 to control stresses to the active region 3 in channel width directions.

As described above, according to this modification, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 44.

Third Embodiment

A third embodiment of the present invention will be described. In this embodiment will be described a case of a layout in which an NMOS transistor group constituted by a plurality of NMOS transistors arranged and a PMOS transistor group constituted by a plurality of PMOS transistors are formed in areas on a silicon substrate independent of each other. The same components as in the first embodiment are denoted by the same reference numerals as in the first embodiment.

Figure 16:
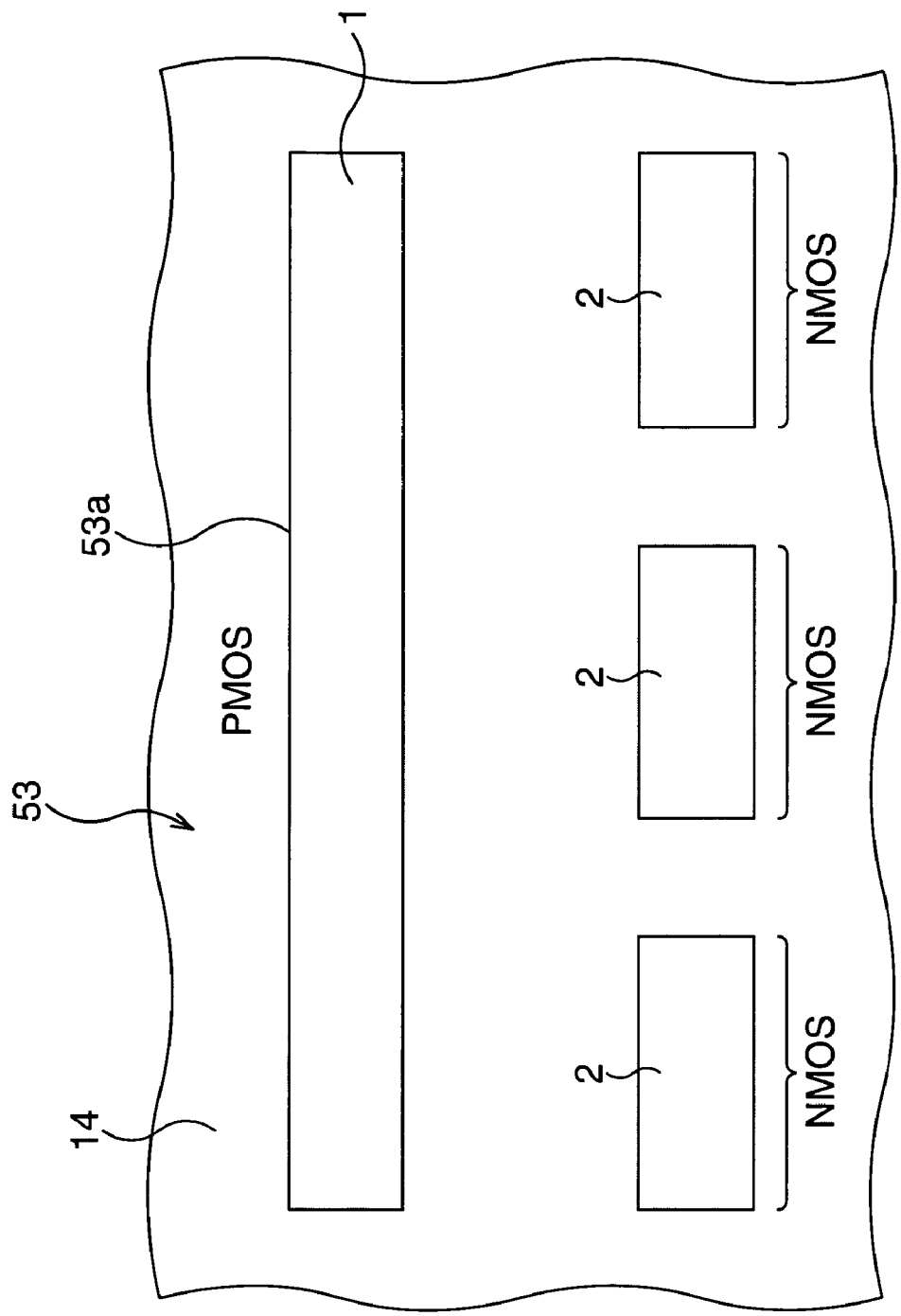
FIG. 16 is a schematic plan view showing a particularly principal step of a manufacturing method of a CMOS transistor according to a third embodiment of the present invention.
Figure 17:
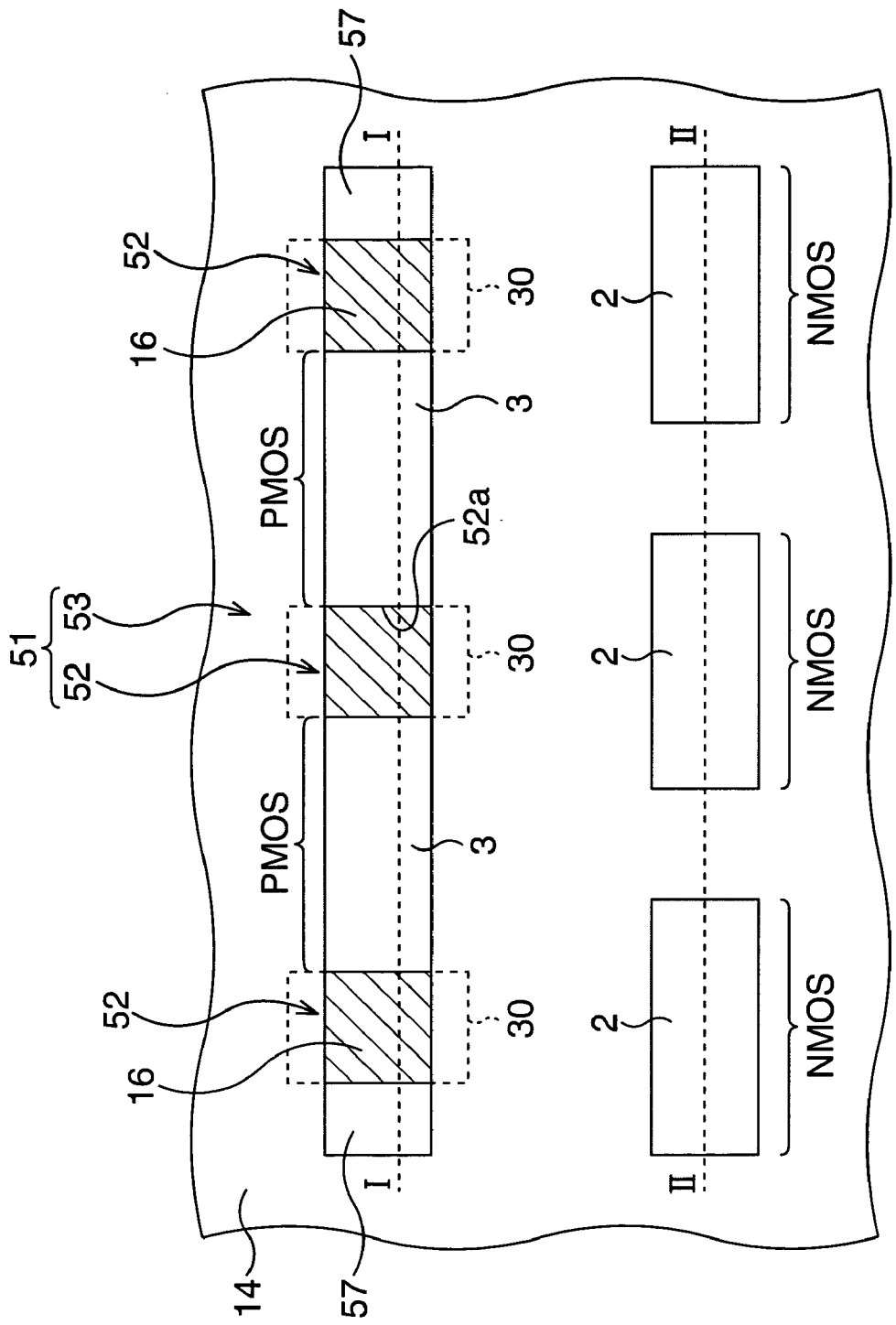
FIG. 17 is a schematic plan view showing a particularly principal step of the manufacturing method of the CMOS transistor according to the third embodiment.
Figure 18:
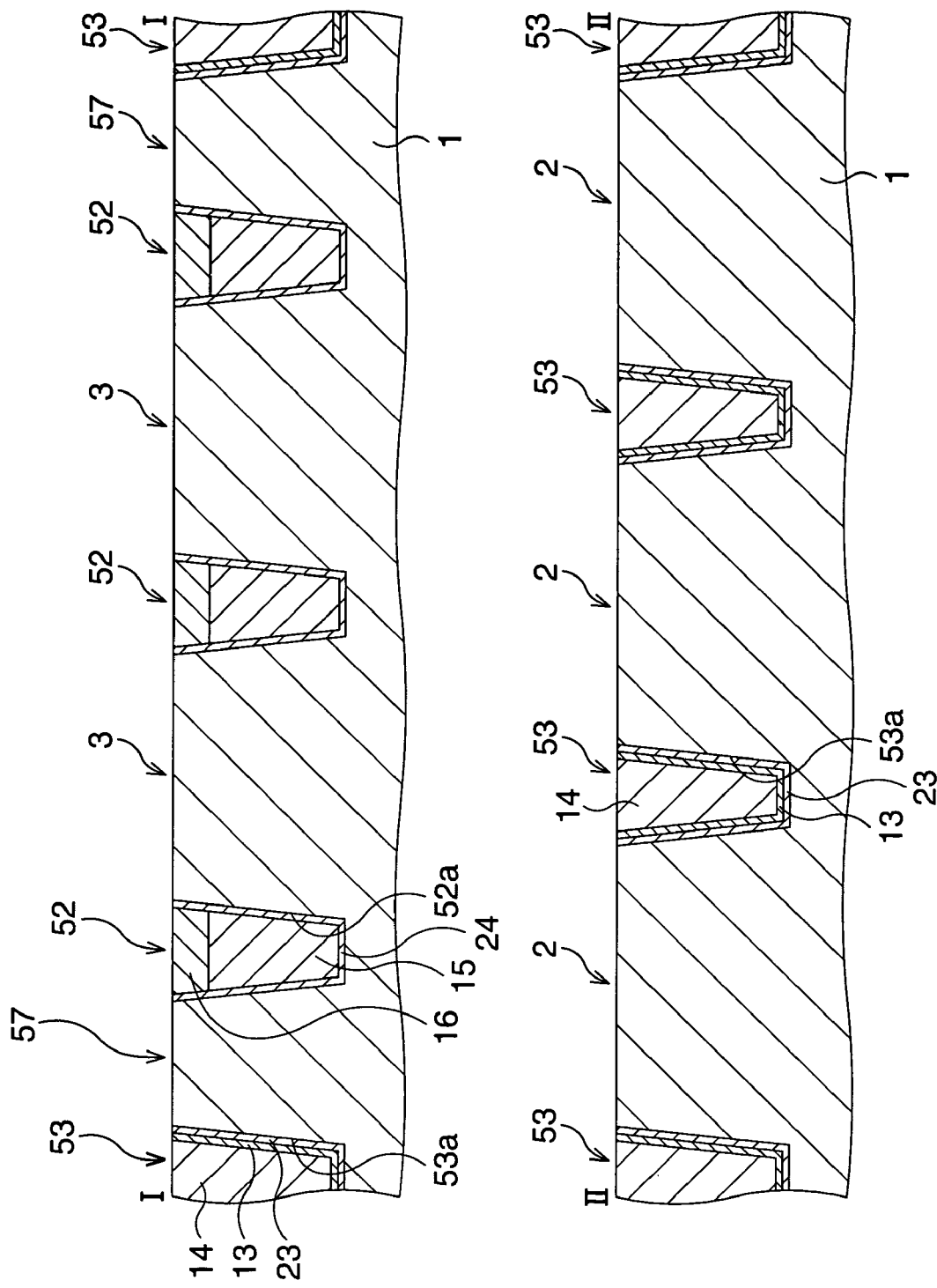
FIG. 18 shows schematic sectional views taken along broken lines I-I and II-II in FIG. 17, put in parallel.

FIGS. 16 and 17 are schematic plan views showing particularly principal steps of a manufacturing method of a CMOS transistor according to this embodiment. FIG. 18 shows schematic sectional views taken along broken lines I-I and II-II in FIG. 17, put in parallel.

In FIGS. 16 and 17, a region where an NMOS transistor is to be formed is represented by NMOS, and a region where a PMOS transistor is to be formed is represented by PMOS. In this embodiment will be described an example in which an NMOS transistor group (three NMOS transistors are arranged in FIGS. 16 and 17) and a PMOS transistor group (two PMOS transistors are arranged in FIGS. 16 and 17) are formed in areas on a silicon substrate 1 independent of each other. In this embodiment, an active region 2 of an NMOS transistor and an active region 3 of a PMOS transistor are divided by an STI element isolation structure 51. The STI element isolation structure 51 is made up of a first element isolation structure 52 formed in a first element isolation region sandwiching therein each active region 3 of the PMOS transistor group in a channel length direction, and a second element isolation structure 53 formed in a second element isolation region other than the first element isolation region.

First, as shown in FIG. 16, of the STI element isolation structure 51 for demarcating the active regions of the NMOS and PMOS transistors, the second element isolation structure 53 is formed on a silicon substrate 1.

More specifically, first, like in FIG. 2-1A, an about 10 nm-thick silicon oxide film 21 is formed on the entire surface of a semiconductor substrate, i.e., a silicon substrate 1 in this embodiment, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI method, lithography and dry etching are applied to the second element isolation region of the element isolation region on the silicon substrate 1 to remove surface layers of the silicon nitride film 22, the silicon oxide film 21, and the silicon substrate 1 in the second element isolation region, and thereby a trench 53a is formed.

Subsequently, the interior surface of the trench 53a is thermally oxidized to form a silicon oxide film 23. A liner nitride film 13 as a thin nitride film is then formed by a CVD method. The trench 53a is filled up with a sparse insulating material as an insulating material that gives tensile stresses to the active regions 2 and 3, for example, silicon oxide deposited at a temperature not more than its glass transition temperature, i.e., nano clustering silica (NCS) 14 in this embodiment. As the silicon oxide deposited at a temperature not more than its glass transition temperature, in place of the NCS 14, silicon oxide may be deposited by using TEOS. Afterward, by using the silicon nitride film 22 on the silicon substrate 1 as a stopper, the surface layer of the NCS 14 is flattened by CMP to leave the NCS 14 only in the trench 53a. At this time, the second element isolation structure 53 in which the trench 53a has been filled up with the NCS 14 is formed.

Subsequently, as shown in FIGS. 17 and 18, the first element isolation structure 52 of a rectangular shape is formed in the first element isolation region of the element isolation region on the silicon substrate 1.

More specifically, first, by the STI method, lithography and etching are applied to the first element isolation region to remove surface layers of the silicon nitride film 22, the silicon oxide film 21, and the silicon substrate 1, and thereby a rectangular trench 52a is formed. In this embodiment, the trench 52a is formed so that some part of the silicon substrate 1 remains at ends of PMOSs at both ends of the PMOS transistor group. Dummy active regions 57 are thereby formed at the ends of the PMOSs at both ends of the PMOS transistor group.

Subsequently, the interior surface of the trench 52a is thermally oxidized to form a silicon oxide film 24. HDP oxide 15 by an HDP-CVD method as a dense insulating material that gives the active region 3 a compressive stress in a channel length direction, is deposited in the middle of the trench 52a so as not to completely fill up the trench 52a.

Subsequently, about 50 nm-thick amorphous or polycrystalline silicon, i.e., polycrystalline silicon (not shown) in this embodiment, is deposited at, for example, 650° C., by a CVD method to fill up the trench 52a. Afterward, by using the silicon nitride film 22 on the silicon substrate 1 as a stopper, a surface layer of the polycrystalline silicon is flattened by CMP to leave the polycrystalline silicon only in the trench 52a. In this CMP process, because the dummy active regions 57 exist at the ends of PMOSs at both ends of the PMOS transistor group, the surface layer of the polycrystalline silicon can be flattened accurately and surely.

Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 50 nm/0.46=about 108 nm, and thus the silicon oxide 16 serves as a dense insulating material that gives the active region 3 a compressive stress in a channel length direction. At this time, the first element isolation structure 52 in which the trench 52a has been filled up with the HDP oxide 15 and the silicon oxide 16 is formed. By the above, the STI element isolation structure 51 is completed that is made up of the first element isolation structure 52 formed in the first element isolation region and the second element isolation structure 53 formed in the second element isolation region other than the first element isolation structure 52.

Subsequently, the remaining silicon nitride film 22 and silicon oxide film 21 are removed by wet etching. At this time, in each NMOS, its four sides are surrounded by the second element isolation structure 53 to demarcate the active region 2. Contrastingly, in each PMOS, the first element isolation structure 52 is provided for two of four sides parallel to a channel length direction and the second element isolation structure 53 is provided for two sides parallel to a channel width direction. The active region 3 is divided by thus being surrounded by the first and second element isolation structures 52 and 53.

Afterward, through manufacturing steps like in FIGS. 2-1C and 2-2A to 2-2C of the first embodiment and desired subsequent steps, a CMOS transistor is completed that is made up of an NMOS transistor in each active region 2 and a PMOS transistor in each active region 3.

In this embodiment, in the active region 2 of NMOS, its four sides are surrounded by the second element isolation structure 53, and the second element isolation structure 53 has been filled with the sparse NCS 14. Therefore, the four sides of the active region 2 are given tensile stresses that cause an improvement of the operation current of the NMOS transistor. Further, the liner nitride film 13 is provided in the second element isolation structure 53 to control stresses to the active region 2.

On the other hand, in the active region 3 of PMOS, the first element isolation structure 52 is provided for two sides parallel to a channel length direction, and the second element isolation structure 53 is provided for two sides parallel to a channel width direction. The first element isolation structure 52 has been filled with the dense HDP oxide 15 and the silicon oxide 16 obtained by oxidizing polycrystalline silicon. Therefore, the active region 3 is given stresses that cause an improvement of the operation current of the PMOS transistor, that is, two sides parallel to a channel length direction are given compressive stresses from the first element isolation structure 52 while two sides parallel to a channel width direction are given tensile stresses from the second element isolation structure 53. Further, the liner nitride film 13 is provided in the second element isolation structure 53 to control stresses to the active region 3 in channel width directions.

As described above, according to this embodiment, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 51.

(Modification)

A modification of the third embodiment will be described. In this modification will be described a case of a layout in which an NMOS transistor group constituted by a plurality of NMOS transistors arranged and a PMOS transistor group constituted by a plurality of PMOS transistors are formed in areas on a silicon substrate independent of each other, like the third embodiment. However, part of the formation process of the STI element isolation structure and some of the insulating materials to fill are different from those of the second embodiment. The same components as in the third embodiment are denoted by the same reference numerals as in the third embodiment.

Figure 19:
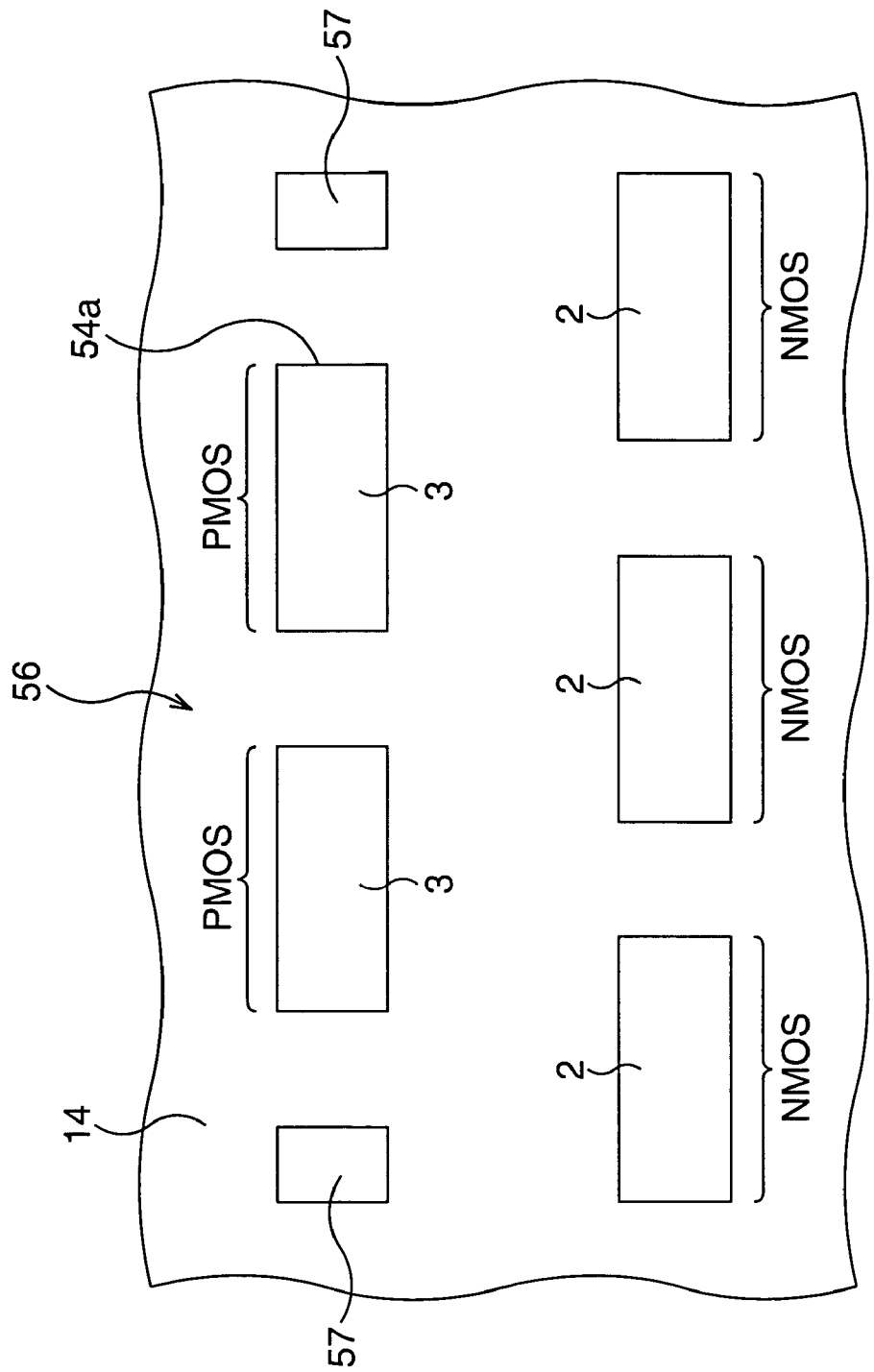
FIG. 19 is a schematic plan view showing a particularly principal step of a manufacturing method of a CMOS transistor according to a modification of the third embodiment.
Figure 20:
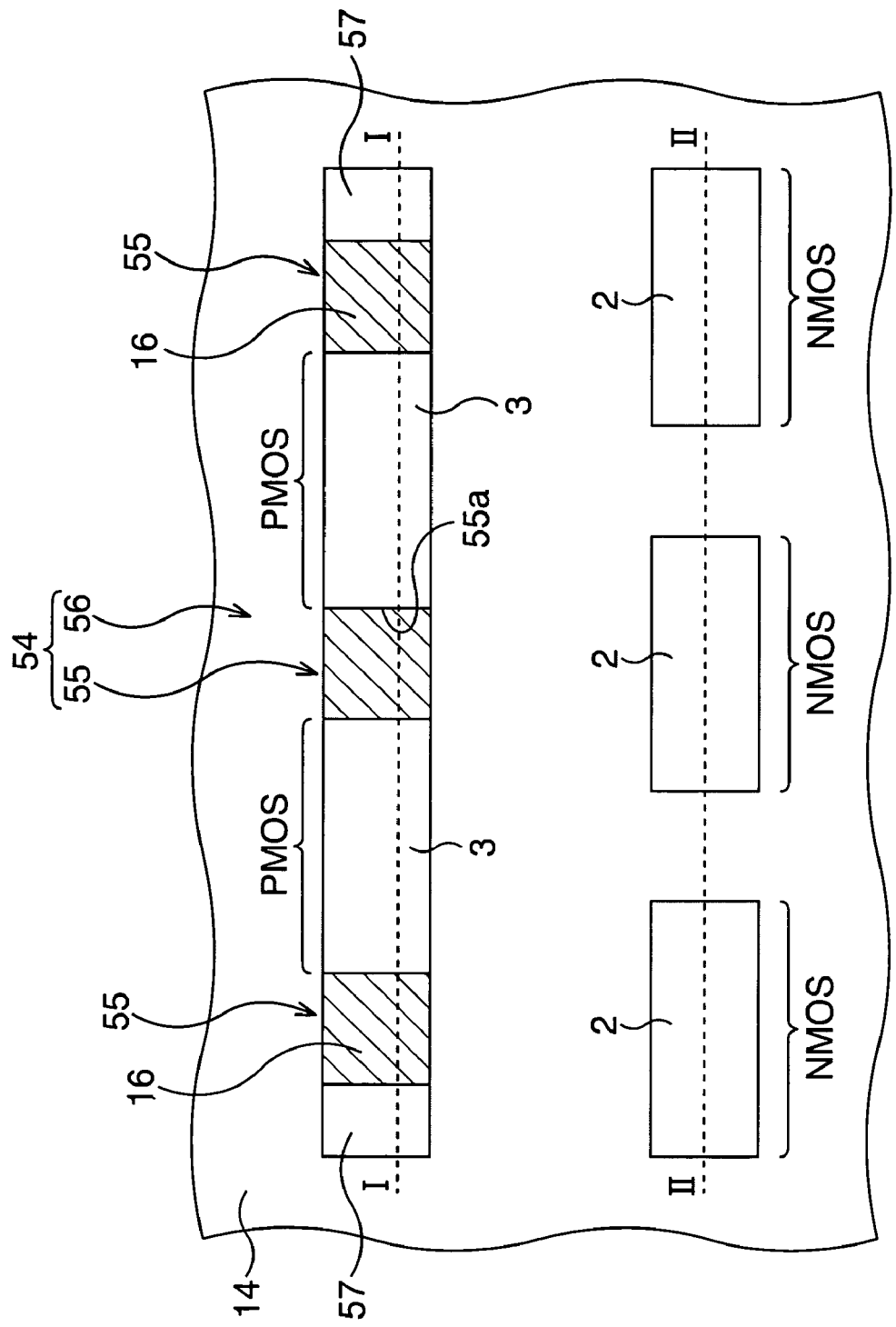
FIG. 20 is a schematic plan view showing a particularly principal step of the manufacturing method of the CMOS transistor according to the modification of the third embodiment.
Figure 21:
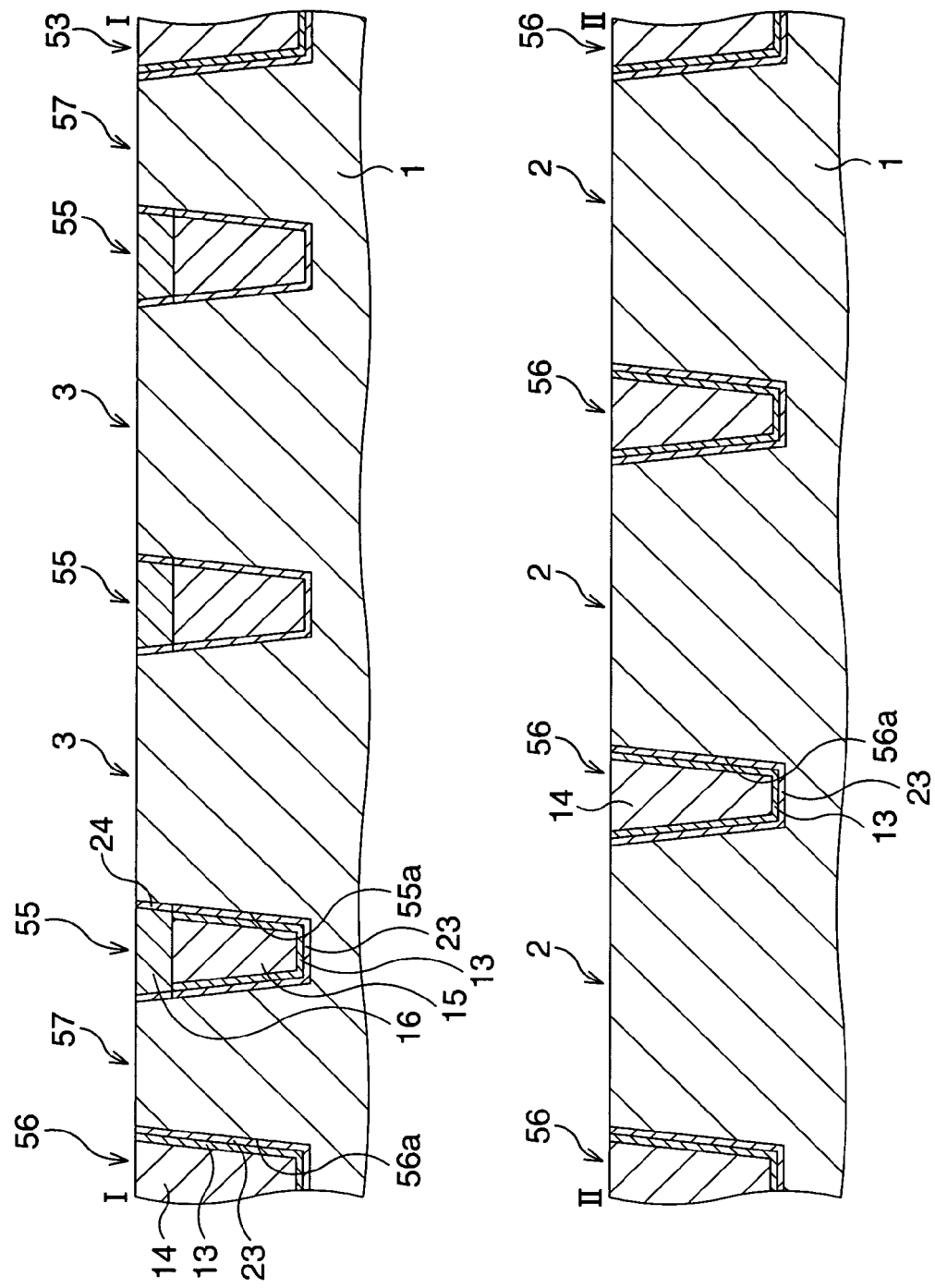
FIG. 21 shows schematic sectional views taken along broken lines I-I and II-II in FIG. 20, put in parallel.

FIGS. 19 and 20 are schematic plan views showing particularly principal steps of a manufacturing method of a CMOS transistor according to this modification. FIG. 21 shows schematic sectional views taken along broken lines I-I and II-II in FIG. 20, put in parallel.

In FIGS. 19 and 20, a region where an NMOS transistor is to be formed is represented by NMOS, and a region where a PMOS transistor is to be formed is represented by PMOS. In this modification will be described an example in which an NMOS transistor group (three NMOS transistors are arranged in FIGS. 19 and 20) and a PMOS transistor group (two PMOS transistors are arranged in FIGS. 19 and 20) are formed in areas on a silicon substrate 1 independent of each other. In this modification, an active region 2 of an NMOS transistor and an active region 3 of a PMOS transistor are divided by an STI element isolation structure 54. The STI element isolation structure 54 is made up of a first element isolation structure 55 formed in a first element isolation region sandwiching therein each active region 3 in a channel length direction, and a second element isolation structure 56 formed in a second element isolation region other than the first element isolation region.

In this modification, first, as shown in FIG. 19, a trench 54a of the STI element isolation structure 54 for demarcating the active regions of the NMOS and PMOS transistors is formed on a silicon substrate 1, and then the trench 54a is filled up with NCS 14 as an insulating material for the second element isolation structure 56.

More specifically, first, like in FIG. 2-1A, an about 10 nm-thick silicon oxide film 21 is formed on the entire surface of a semiconductor substrate, i.e., a silicon substrate 1 in this modification, by a thermal oxidation method. An about 110 nm-thick silicon nitride film 22 is then formed on the silicon oxide film 21 at 750° C. by a CVD method using $SiH_2Cl_2$ and $NH_3$ as source gases.

Subsequently, by an STI method, lithography and dry etching are applied to the element isolation region on the silicon substrate 1 to remove surface layers of the silicon nitride film 22, the silicon oxide film 21, and the silicon substrate 1 in the element isolation region, and thereby a trench 54a is formed.

Subsequently, the interior surface of the trench 54a is thermally oxidized to form a silicon oxide film 23. A liner nitride film 13 as a thin nitride film is then formed by a CVD method. The trench 44a is filled up with a sparse insulating material as an insulating material that gives tensile stresses to the active regions 2 and 3, for example, silicon oxide deposited at a temperature not more than its glass transition temperature, i.e., NCS 14 in this modification. As the silicon oxide deposited at a temperature not more than its glass transition temperature, in place of the NCS 14, silicon oxide may be deposited by using TEOS. Afterward, by using the silicon nitride film 22 as a stopper, the surface layer of the NCS 14 is flattened by CMP to leave the NCS 14 only in the trench 54a.

Subsequently, as shown in FIGS. 20 and 21, the first element isolation structure 55 of a rectangular shape is formed in the first element isolation region of the element isolation region on the silicon substrate 1, and the second element isolation structure 56 is formed.

More specifically, first, lithography and etching are applied to a portion of the silicon nitride film 22 in the trench 54a corresponding to the first element isolation region to remove only surface layers of the NCS 14, liner nitride film 13, and silicon oxide film 23 of that portion, and thereby a rectangular trench 55a is formed. In this modification, the first element isolation region is patterned by baking a pattern 30 shown by a broken line in FIG. 20 so as to be perpendicular to the surface layer of the silicon substrate 1 patterned. In the case that the trench 54a has its depth of about 400 nm, the quantity of the above removal is controlled to about 100 nm. In this case, therefore, the trench 55a has its depth of about 100 nm. In this modification, the trench 55a is formed so that some part of the silicon substrate 1 remains at ends of PMOSs at both ends of the PMOS transistor group. Dummy active regions 57 are thereby formed at the ends of the PMOSs at both ends of the PMOS transistor group.

Subsequently, the interior surface of the trench 55a is thermally oxidized to form a silicon oxide film 24. Afterward, about 100 nm-thick amorphous or polycrystalline silicon, i.e., polycrystalline silicon (not shown) in this modification, is deposited at, for example, 650° C., by a CVD method to fill up the trench 55a. Afterward, by using the silicon nitride film 22 on the silicon substrate 1 as a stopper, a surface layer of the polycrystalline silicon is flattened by CMP to leave the polycrystalline silicon only in the trench 55a. In this CMP process, because the dummy active regions 57 exist at the ends of the PMOSs at both ends of the PMOS transistor group, the surface layer of the polycrystalline silicon can be flattened accurately and surely.

Afterward, the polycrystalline silicon is completely oxidized by wet oxidation at 1000° C. to form silicon oxide 16. The polycrystalline silicon expands by the wet oxidation, and the silicon oxide 16 has its thickness of, for example, 100 nm/0.46=about 216 nm, and thus the silicon oxide 16 serves as a dense insulating material that gives the active region 3 a compressive stress in a channel length direction. At this time, the first element isolation structure 55 in which the trench 55a has been filled up with the NCS 14 and the silicon oxide 16 is formed. Simultaneously with this, the second element isolation structure 56 in which the trench 56a has been filled up with the NCS 14 is formed. By the above, the STI element isolation structure 54 is completed that is made up of the first element isolation structure 55 formed in the first element isolation region and the second element isolation structure 56 formed in the second element isolation region other than the first element isolation structure 55.

Subsequently, the remaining silicon nitride film 22 and silicon oxide film 21 are removed by wet etching. At this time, in each NMOS, its four sides are surrounded by the second element isolation structure 56 to demarcate the active region 2. Contrastingly, in each PMOS, the first element isolation structure 55 is provided for two of four sides parallel to a channel length direction and the second element isolation structure 56 is provided for two sides parallel to a channel width direction. The active region 3 is divided by thus being surrounded by the first and second element isolation structures 55 and 56.

Afterward, through manufacturing steps like in FIGS. 2-1C and 2-2A to 2-2C and desired subsequent steps, a CMOS transistor is completed that is made up of an NMOS transistor in each active region 2 and a PMOS transistor in each active region 3.

In this modification, in the active region 2 of NMOS, its four sides are surrounded by the second element isolation structure 56, and the second element isolation structure 56 has been filled with the sparse NCS 14. Therefore, the four sides of the active region 2 are given tensile stresses that cause an improvement of the operation current of the NMOS transistor. Further, the liner nitride film 13 is provided in the second element isolation structure 56 to control stresses to the active region 2.

On the other hand, in the active region 3 of PMOS, the first element isolation structure 55 is provided for two sides parallel to a channel length direction, and the second element isolation structure 56 is provided for two sides parallel to a channel width direction. The upper layer portion of the first element isolation structure 55 has been filled with the dense silicon oxide 16. Therefore, the active region 3 is given stresses that cause an improvement of the operation current of the PMOS transistor, that is, two sides parallel to a channel length direction are given compressive stresses from the first element isolation structure 55 while two sides parallel to a channel width direction are given tensile stresses from the second element isolation structure 56. Further, the liner nitride film 13 is provided in the second element isolation structure 56 to control stresses to the active region 3 in channel width directions.

As described above, according to this modification, a CMOS transistor is realized that intends to improve both the operation currents of N-type and P-type MOS transistors, and contributes further scale-down of element size, without any change in the structures of the N-type and P-type MOS transistors and without adding any extra manufacturing step after formation of the STI element isolation structure 54.

According to the present invention, a semiconductor device is realized that intends to improve both the operation currents of first and second conductivity type elements, and contributes further scale-down of element size, without any change in transistor structure and without adding any extra manufacturing step after formation of an element isolation structure.

What is claimed is:

1. A semiconductor device comprising:
    an element isolation structure in which trenches formed in an element isolation region on a semiconductor substrate are filled up with insulating materials;
    a first conductivity type element formed in a first active region divided by said element isolation structure; and
    a second conductivity type element formed in a second active region divided by said element isolation structure, said element isolation structure comprising:
        a first element isolation region of said element isolation region including regions adjacent to a pair of opposed ends of said second active region, said first element isolation region being filled with a first insulating material
        a second element isolation region of said element isolation; other than said first element isolation region, said second element isolation region being filled with a second insulating material which is sparser than the first insulating material;
        an upper layer portion of said first element isolation region is filled with said first insulating material; and
        said first insulating material is an HDP silicon oxide and said second insulating material is nano clustering silica (NCS); and
    wherein said first element isolation region is entirely surrounded by said first active region, said second active region and said second element isolation region.

2. The semiconductor device according to claim 1, wherein a gate electrode is formed into a pattern on each of said first and second active regions with a gate insulating film being interposed, and the gate electrode on said second active region extends parallel to said first element isolation region.

3. The semiconductor device according to claim 1, wherein either of said first and second conductivity type elements is a transistor, and said pair of opposed ends of said second active region are both ends of said second active region parallel to a width of a gate of the second conductivity type transistor.

4. The semiconductor device according to claim 1, wherein first and second conductivity type elements are alternately arranged, and said first element isolation region is formed between each pair of first and second conductivity type elements.

5. The semiconductor device according to claim 1, wherein a first conductivity type element group is constituted by a plurality of first conductivity type elements arranged, each second conductivity type element and said first conductivity type element group are formed in areas on said semiconductor substrate independent of each other, and said first element isolation region is formed so as to sandwich therein each second active region.

6. The semiconductor device according to claim 1, wherein a first conductivity type element group constituted by a plurality of first conductivity type elements arranged and a second conductivity type element group constituted by a plurality of second conductivity type elements arranged are formed in areas on said semiconductor substrate independent of each other, and said first element isolation region is formed so as to sandwich therein each second active region of said second conductivity type element group.

7. The semiconductor device according to claim 1, wherein only an upper layer portion of said first element isolation region is filled with said first insulating material.

8. The semiconductor device according to claim 1, wherein upper and lower layer portions of said first element isolation region are filled with different insulating materials that give compressive stresses.

9. The semiconductor device according to claim 1, wherein said first insulating material is one selected from a group of highly dense plasma oxide, oxide of amorphous silicon, and oxide of polycrystalline silicon, and said first insulating material is silicon oxide deposited at a temperature not more than its glass transition temperature.

10. The semiconductor device according to claim 1, wherein said second element isolation region is filled with said second insulating material with a liner nitride film interposed.

11. The semiconductor device according to claim 5, wherein dummy active regions are formed at both ends of each second conductivity type element.

12. The semiconductor device according to claim 6, wherein dummy active regions are formed at both ends of said second conductivity type element group.

13. The semiconductor device according to claim 7, wherein a lower layer portion of said first element isolation region is filled with the same insulating material as said second insulating material in said second element isolation region.

* * * * *